United States Patent [19]
Yaegashi et al.

[11] Patent Number: 5,928,390
[45] Date of Patent: Jul. 27, 1999

[54] VERTICAL PROCESSING APPARATUS

[75] Inventors: Hidetami Yaegashi, Kokubunji; Takayuki Toshima, Yamanashi-ken; Masami Akimoto, Kumamoto; Eiji Yamaguchi, Yamanashi-ken; Junichi Kitano, Kofu; Takayuki Katano, Nirasaki; Hiroshi Shinya, Kofu; Naruaki Iida, Kumamoto, all of Japan

[73] Assignee: Tokyo Electron Limited, Tokyo, Japan

[21] Appl. No.: 08/787,862

[22] Filed: Jan. 23, 1997

[30] Foreign Application Priority Data

| Jan. 26, 1996 | [JP] | Japan | ................................... | 8-031249 |
| May 30, 1996 | [JP] | Japan | ................................... | 8-137264 |

[51] Int. Cl.$^6$ .......................... H01L 21/68; H01L 21/027; B23P 21/00; B65G 49/07
[52] U.S. Cl. ............................................. 29/25.01; 118/50
[58] Field of Search ............................... 29/25.01; 118/50

[56] References Cited

U.S. PATENT DOCUMENTS

| 4,943,457 | 7/1990 | Davis et al. . |
| 5,253,663 | 10/1993 | Tanaka et al. . |
| 5,326,316 | 7/1994 | Hashimoto et al. . |
| 5,339,128 | 8/1994 | Tateyama et al. . |
| 5,361,449 | 11/1994 | Akimoto . |
| 5,380,684 | 1/1995 | Ohkuma . |
| 5,451,131 | 9/1995 | Hecht et al. . |
| 5,498,294 | 3/1996 | Matsushita et al. . |
| 5,565,034 | 10/1996 | Nanbu et al. . |
| 5,620,560 | 4/1997 | Akimoto et al. . |
| 5,626,913 | 5/1997 | Tomoeda et al. . |
| 5,711,646 | 1/1998 | Ueda et al. . |
| 5,725,664 | 3/1998 | Nanbu et al. . |
| 5,826,129 | 10/1998 | Hasebe et al. . |

FOREIGN PATENT DOCUMENTS

| 0 335 752 | 10/1989 | European Pat. Off. . |
| 3-274746 | 12/1991 | Japan . |
| 8-46010 | 2/1996 | Japan . |
| 8-97134 | 4/1996 | Japan . |
| 8-222618 | 8/1996 | Japan . |
| 2 217 107 | 10/1989 | United Kingdom . |

*Primary Examiner*—David Graybill
*Attorney, Agent, or Firm*—Oblon, Spivak, McClelland, Maier & Neustadt, P.C.

[57] ABSTRACT

A processing apparatus comprises a plurality of process unit groups each including a plurality of process units for subjecting an object to a series of processes, the process units being arranged vertically in multiple stages, an object transfer space being defined among the process unit groups, and a transfer mechanism for transferring the object, the transfer mechanism having a transfer member vertically movable in the object transfer space, the transfer member being capable of transferring the object to each of the process units. The processing apparatus further comprises a mechanism for forming a downward air flow in the object transfer space, a mechanism for controlling the quantity of the downward air flow, and a mechanism for controlling the pressure in the object transfer space. Thus, a variation in condition of the object transfer space is reduced.

49 Claims, 20 Drawing Sheets

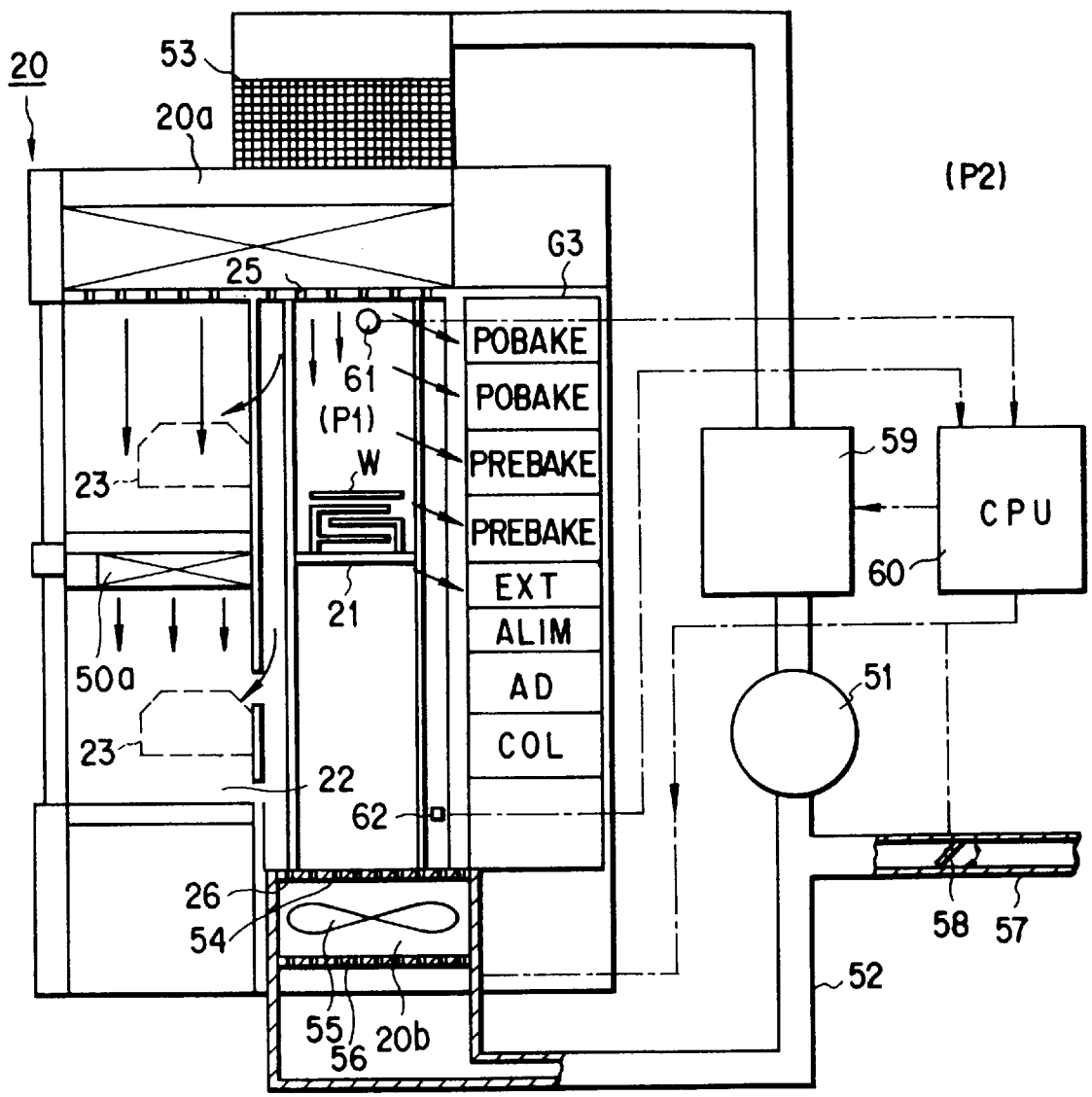
F I G. 5

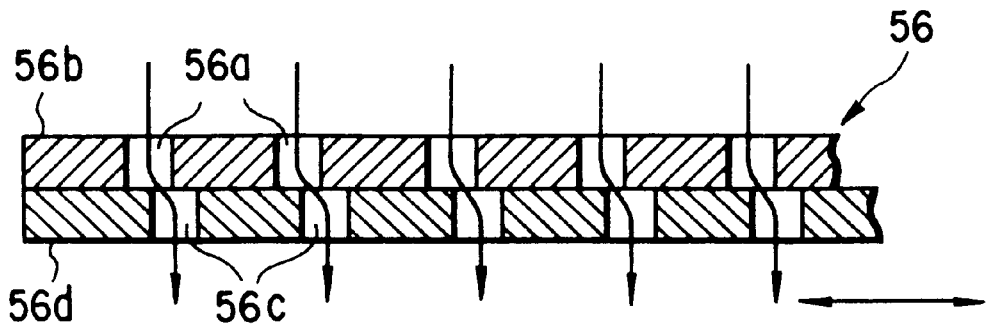
F I G. 6A
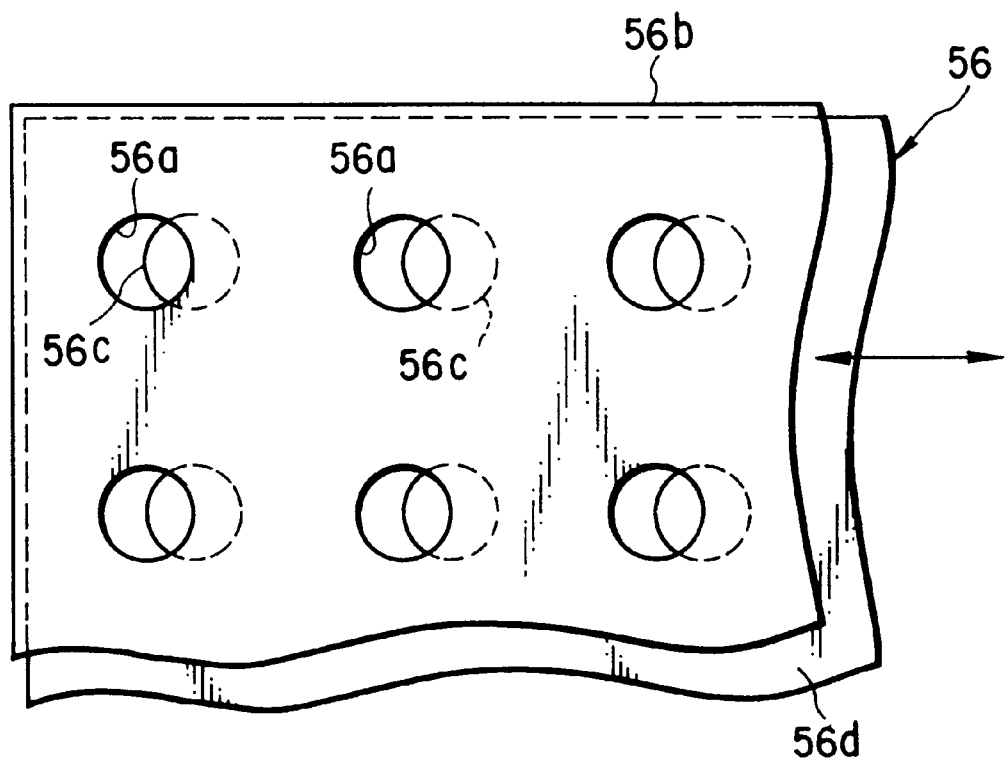
F I G. 6B

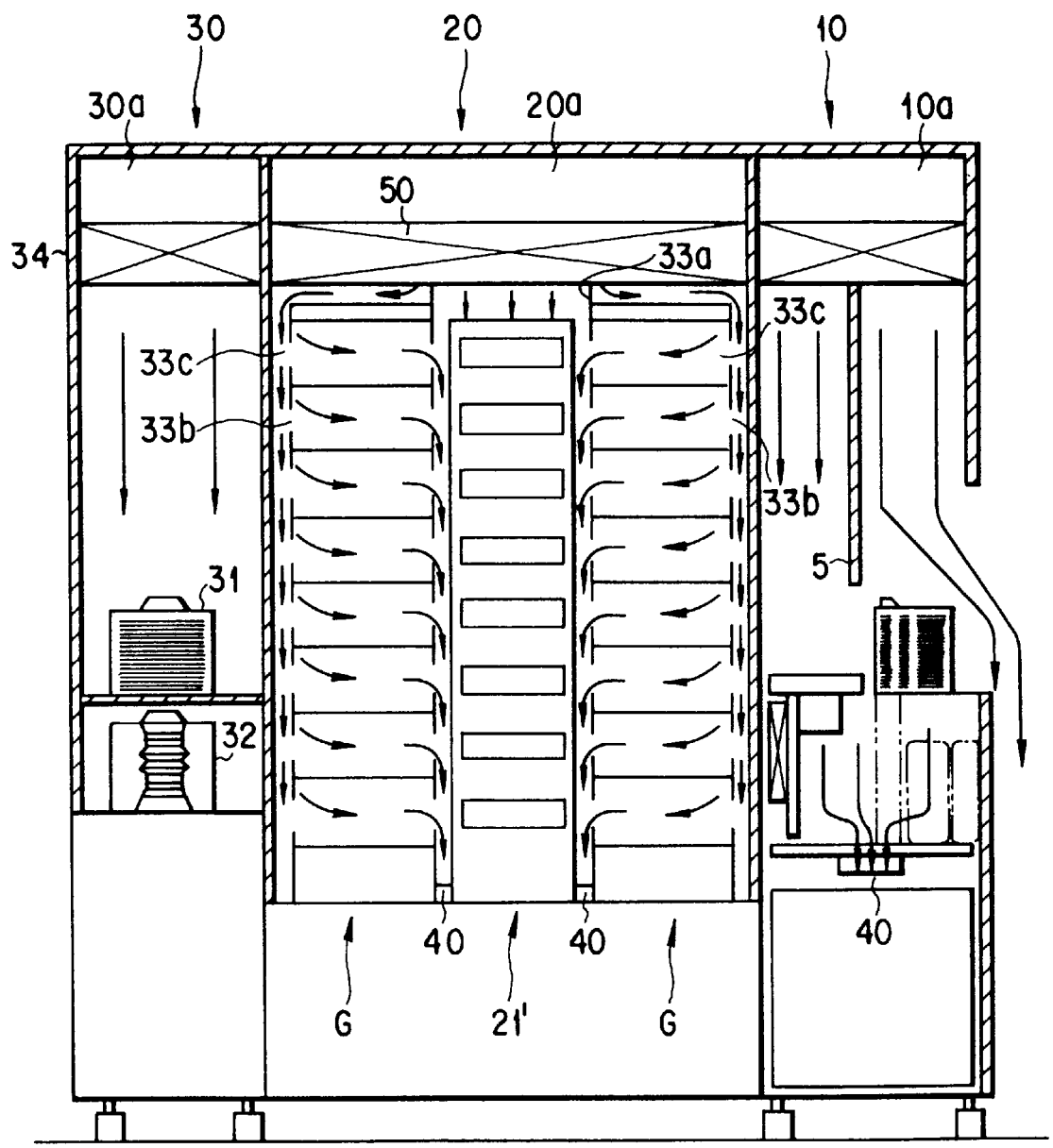
F I G. 12

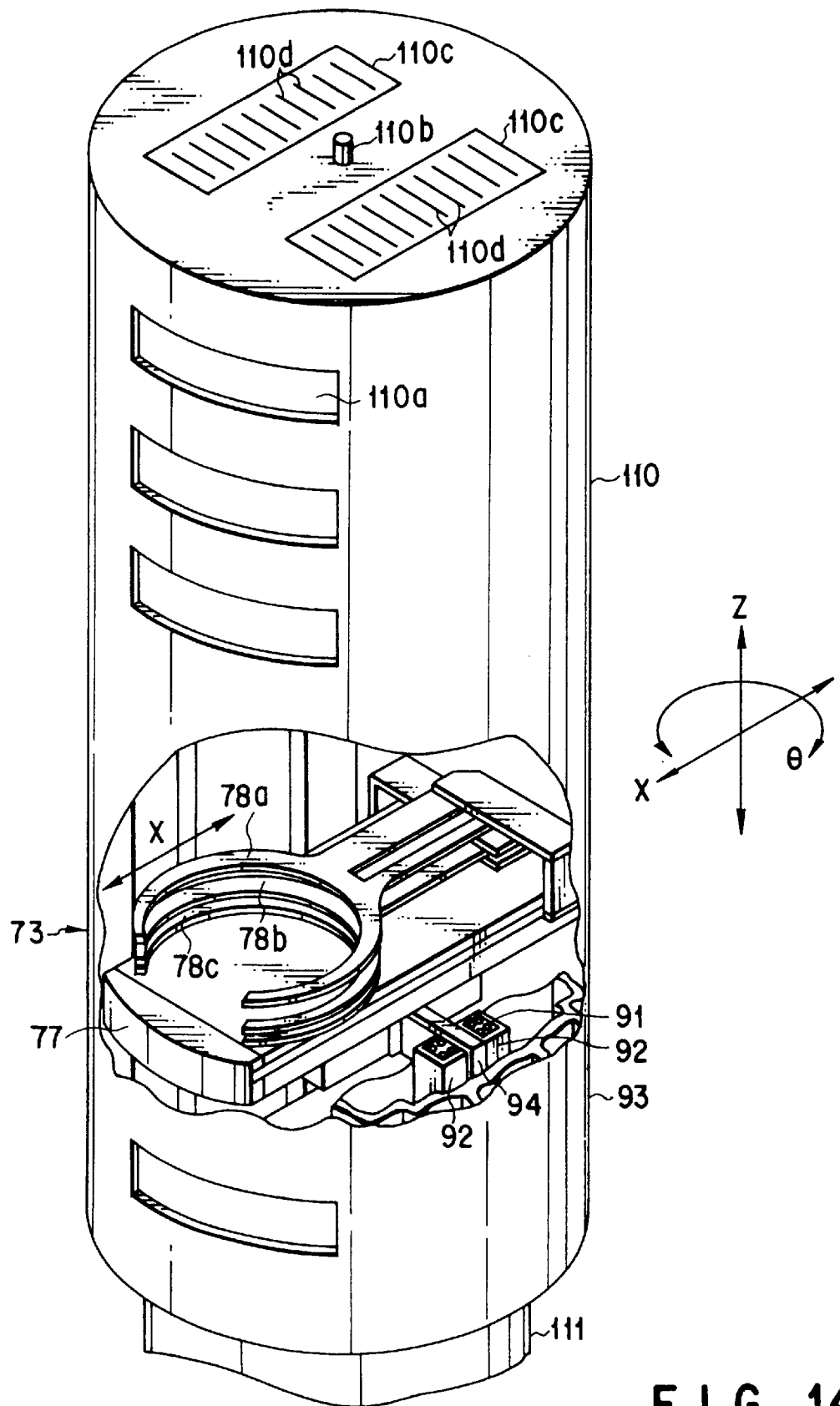
F I G. 14

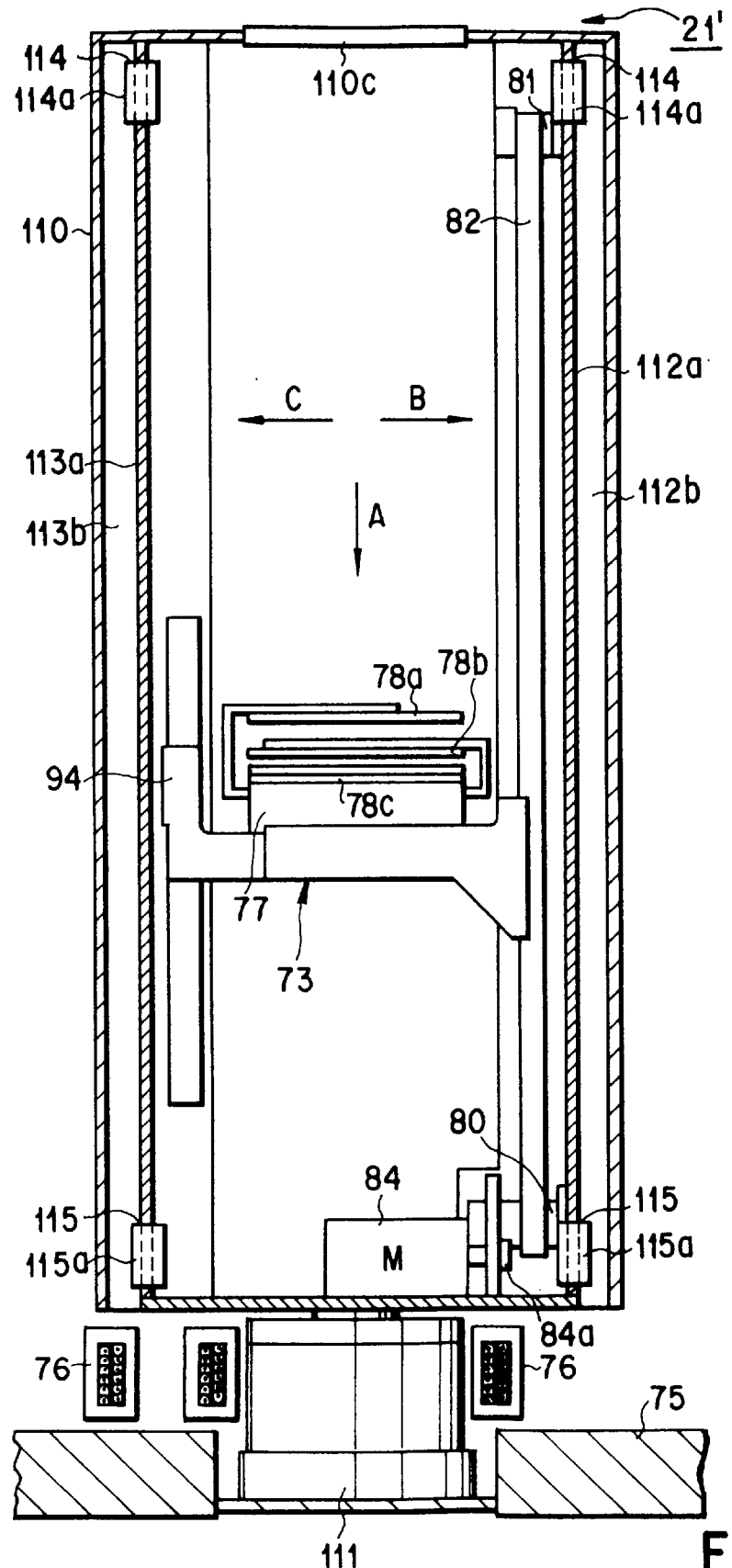
F I G. 15

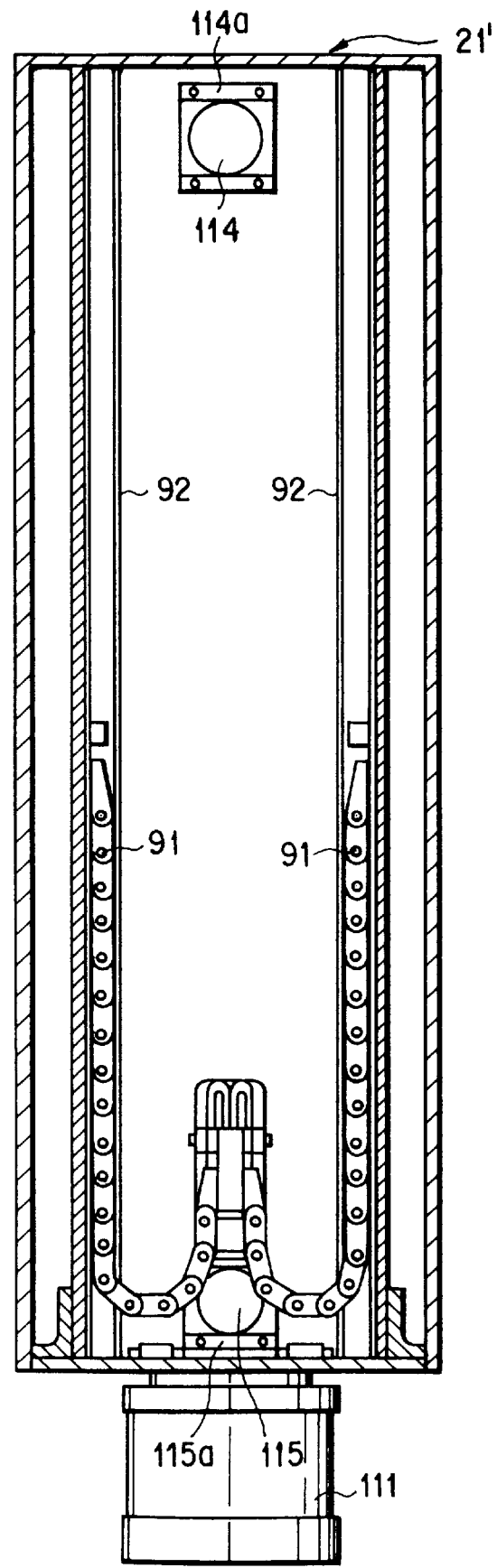
F I G. 18

VERTICAL PROCESSING APPARATUS

BACKGROUND OF THE INVENTION

The present invention relates to a processing apparatus for subjecting an object, such as a semiconductor wafer or an LCD substrate, to processes of coating, development, etc.

A process for fabricating a semiconductor device includes a series of steps of applying a treatment liquid such as a photoresist liquid to a semiconductor wafer represented by a silicon wafer, exposing a film of the photoresist liquid with a circuit pattern, etc. reduced in size by means of photolithography techniques, and developing the photoresist film.

The above-mentioned coating/developing process system comprises, as an integrated structure, a cassette station for carrying a semiconductor wafer, as an object to be processed, into/out of a cassette; a washing unit for washing the wafer; an adhesion unit for dehydrating the surface of the wafer; a cooling unit for cooling the wafer down to a predetermined temperature; a resist coating unit for coating a resist liquid on the surface of the wafer; a baking unit for prebaking or postbaking the wafer prior to or following the coating of resist liquid; a peripheral exposure unit for removing a resist portion from a peripheral area of the wafer; a wafer transfer table for transfer of the wafer to/from an adjacent exposure device; and a developing unit for applying a developing liquid to the exposed wafer and selectively dissolving a sensitized or non-sensitized portion in the developing liquid. Thus, the manufacture of the semiconductor device is efficiently carried out.

In this type of process system, a wafer transfer path is generally provided at a central part of the system in the longitudinal direction. The respective units are disposed on both sides of the transfer path, with their front sides facing the transfer path. A wafer transfer device for transferring wafers to the respective units is provided movable over the wafer transfer path. Since the system has a laterally elongated structure wherein various process units are arranged along the horizontally extending wafer transfer path, the space for installation of the system is great, resulting in a high cost of the clean room. In particular, if the cleanness of the entire system or respective parts is to be enhanced by a vertical laminar flow method that is applicable effectively to this type of system, the initial costs and maintenance costs of an air-conditioner, a filter, etc. increase due to the large space.

Jpn. Pat. Appln. KOKAI Publication No. 4-85812 proposes a process system wherein a wafer transfer device is disposed to be movable vertically and rotatable about a vertical axis, and process units are provided in multiple stages around the wafer transfer device.

According to this process system, the space for installation of the system is reduced and accordingly the cost for the clean room is reduced. In addition, the speed of transferring and accessing wafers is increased. Thus, the throughput in this system increases.

In this type of process system, however, wafers are subjected to predetermined processes in the process units arranged in multiple stages and consequently the condition of clean air fed into the process system, e.g. the quantity, temperature and/or pressure, may vary. If the condition of air within the process system varies, proper processing cannot be carried out, with the result that the process performance and yield will lower. In particular, since the space for movement of the wafer transfer device is substantially sealed, the air containing particles produced from a wafer transfer device driving unit is compressed at upper and lower end regions of the space for movement, dispersed, and let to flow into the respective peripheral units. Consequently, the yield of semiconductor devices deteriorates. In particular, when the transfer device is rotated, a great deal of particles are produced and this problem becomes more serious.

If the air fed into the process system is discharged after processing, particles or contaminants such as amine produced within the process system are brought into the clean room. As a result, the cleanness as well as the life of the clean room decreases. Further, if organic contaminants such as amine are present within the clean room, such contaminants will adversely affect other processing apparatuses within the clean room, e.g. a CVD apparatus for forming a thin film.

BRIEF SUMMARY OF THE INVENTION

An object of the present invention is to provide a processing apparatus wherein a variation in the condition of clean air fed into the apparatus can be reduced to a minimum.

Another object of the invention is to provide a processing apparatus wherein particles produced while a transfer member for transferring an object to be processed is vertically moved.

Still another object of the invention is to provide a processing apparatus capable of constantly feeding clean air into respective process units.

According to an aspect of the present invention, there is provided a processing apparatus comprising: a plurality of process unit groups each including a plurality of process units for subjecting an object to a series of processes, the process units being arranged vertically in multiple stages, an object transfer space being defined among the process unit groups; transfer means for transferring the object, the transfer means having a transfer member vertically movable in the object transfer space, the transfer member being capable of transferring the object to each of the process units; and means for reducing a variation in condition of the object transfer space.

According to another aspect of the invention, there is provided a processing apparatus comprising: a plurality of process unit groups each including a plurality of process units for subjecting an object to a series of processes, the process units being arranged vertically in multiple stages, an object transfer space being defined among the process unit groups; transfer means for transferring the object, the transfer means having a transfer member vertically movable in the object transfer space, the transfer member being capable of transferring the object to each of the process units; means for forming a downward cleaning air flow in the object transfer space; and means for preventing air from coming into each of the process units from the object transfer space.

According to still another aspect of the invention, there is provided a processing apparatus comprising: a plurality of process unit groups each including a plurality of process units for subjecting an object to a series of processes, the process units being arranged vertically in multiple stages, an object transfer space being defined among the process unit groups; transfer means for transferring the object, the transfer means having a transfer member vertically movable in the object transfer space, the transfer member being capable of transferring the object to each of the process units; an air inlet provided in an upper region of the object transfer space; an exhaust port provided in a lower region in the object transfer space; a pipe for connecting the air inlet and the exhaust port, thereby forming a circulation passage; and air feed means for circulating cleaning air from the air inlet to the exhaust port so that a downward air flow may be formed in the object transfer space.

According to still another aspect of the invention, there is provided a processing apparatus comprising: a plurality of process unit groups each including a plurality of process units for subjecting an object to a series of processes, the process units being arranged vertically in multiple stages, an object transfer space being defined among the process unit groups; transfer means for transferring the object, the transfer means having a transfer member vertically movable in the object transfer space, the transfer member being capable of transferring the object to each of the process units; a duct provided vertically in the object transfer space; and exhaust means for exhausting air compressed due to vertical movement of the transfer member to the duct.

According to still another aspect of the invention, there is provided a processing apparatus comprising: a plurality of process unit groups each including a plurality of process units for subjecting an object to a series of processes, the process units being arranged vertically in multiple stages, an object transfer space being defined among the process unit groups; transfer means for transferring the object, the transfer means having a transfer member vertically movable in the object transfer space, the transfer member being capable of transferring the object to each of the process units, and a frame body surrounding the region for movement of the transfer member; means for forming a downward cleaning air flow in the object transfer space; and means for forming a flow of cleaning air flowing from each of the process units to the object transfer space, wherein the cleaning air flowing out of each of the process units to the object transfer space flows downward along the outside of the frame body by virtue of the downward cleaning air flow.

According to still another aspect of the invention, there is provided a coating/developing processing apparatus comprising: at least one first process unit group in which process units including a resist coating unit for coating a resist and a developing unit for developing a pattern of the resist are vertically stacked; and at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked, wherein the first process unit group has such an arrangement that the coating unit is placed below the developing unit.

According to still another aspect of the invention, there is provided a coating/developing processing apparatus comprising: at least one first process unit group in which process units including a resist coating unit for coating a resist and a developing unit for developing a pattern of the resist are vertically stacked; and at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked, wherein the second process unit group has such an arrangement that the cooling unit is placed below the baking unit.

According to still another aspect of the invention, there is provided a coating/developing process system for subjecting an object to a resist coating process and a developing process, the system comprising: a process section for subjecting the object to a series of processes including the resist coating process and the developing process; a transfer section for performing transfer of the object with another system and with the process section; and an interface section for performing transfer of the object with the process section and with an exposure device, wherein the process section comprises: at least one first process unit group in which process units including a resist coating unit for coating a resist and a developing unit for developing a pattern of the resist are vertically stacked; and at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked, wherein the second process unit group has such an arrangement that the cooling unit is placed below the baking unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a partially enlarged vertical cross-section view showing a main part of the processing apparatus according to the embodiment of the invention which is applied to the system shown in FIG. 1;

FIGS. 6A and 6B are a cross-sectional view and a plan view showing a slit damper serving as pressure adjusting means in the processing apparatus according to the embodiment as applied to the system shown in FIG. 1;

FIG. 12 is a rear view schematically illustrating the flow of clean air in a resist liquid coating/developing process system for a semiconductor wafer, which system comprises a processing apparatus according to another embodiment of the invention;

FIG. 14 is a partially cut-out perspective view schematically showing a main wafer transfer mechanism according to the said another embodiment of the invention;

FIG. 15 is a vertical cross-sectional view showing the structure of a main part of the main wafer transfer mechanism shown in FIG. 14;

FIG. 18 is a side view showing the inside of the main wafer transfer mechanism, as viewed in the direction of arrow C in FIG. 15;

DETAILED DESCRIPTION OF THE INVENTION

An embodiment of the present invention as applied to a resist liquid coating/developing process system for a semiconductor wafer will now be described in detail with reference to the accompanying drawings.

Figure 1:
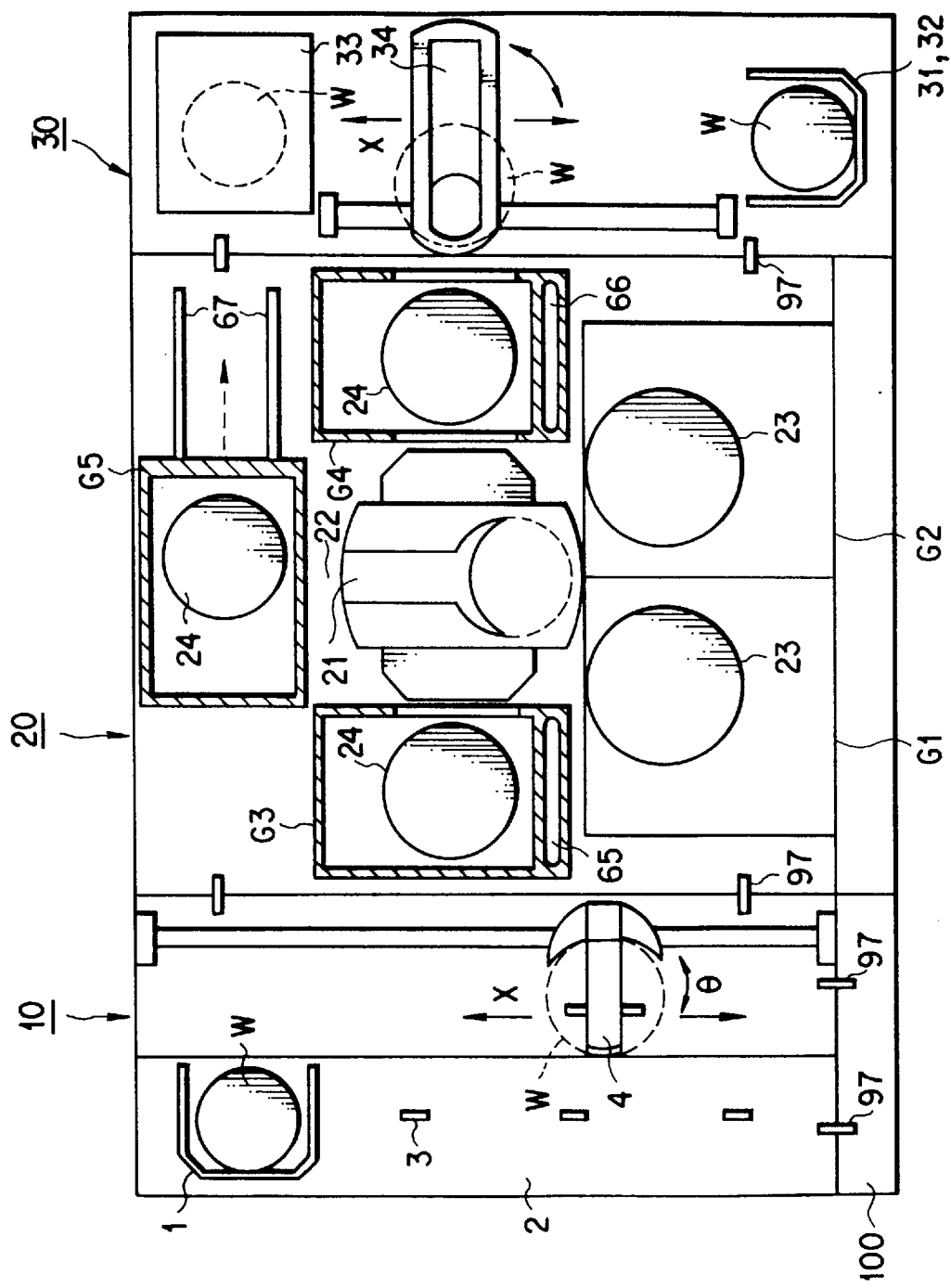
FIG. 1 is a schematic plan view showing a resist liquid coating/developing process system for a semiconductor wafer, which system comprises a processing apparatus according to an embodiment of the present invention.
Figure 2:
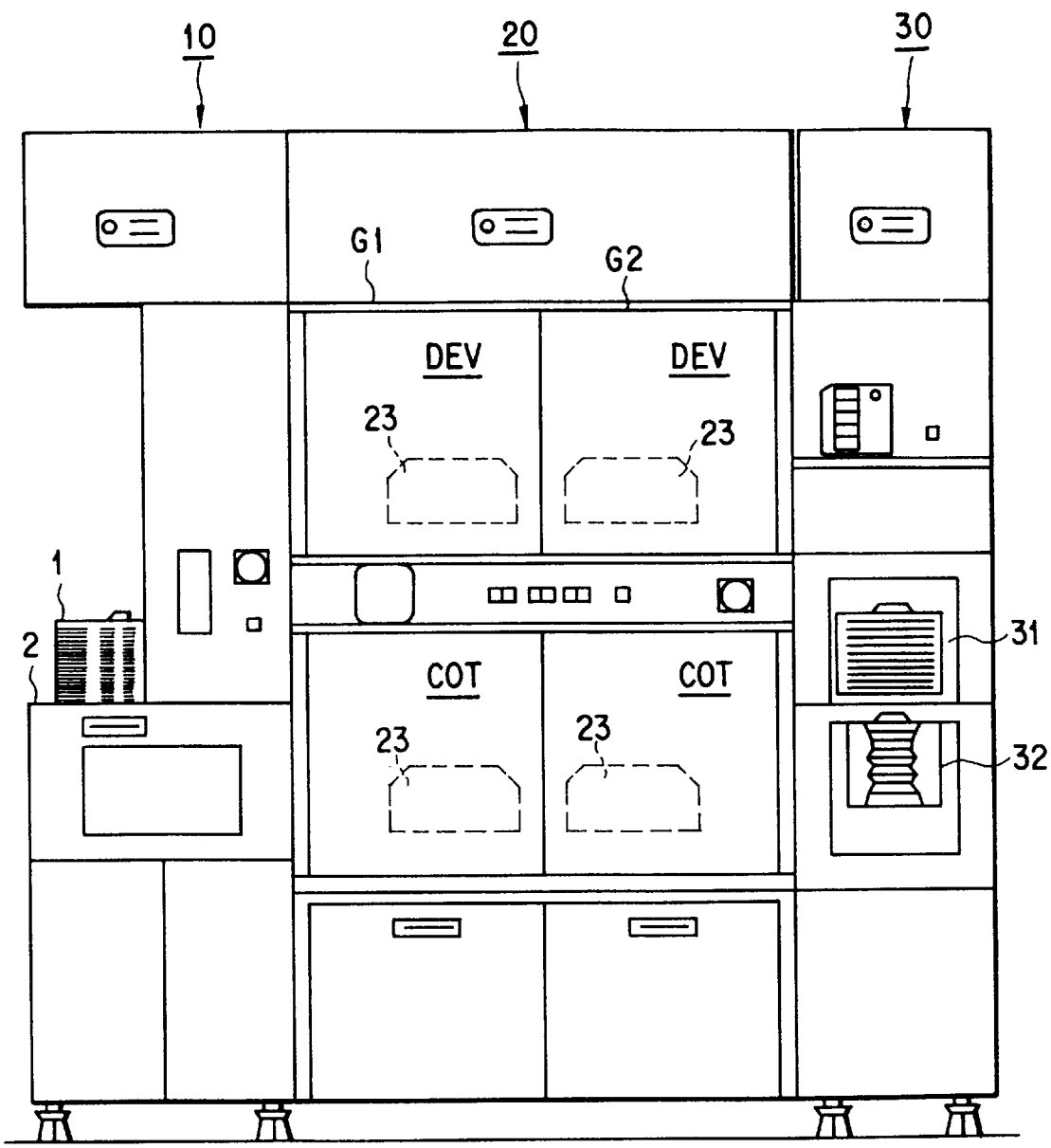
FIG. 2 is a front view of the resist liquid coating/developing system shown in FIG. 1.
Figure 3:
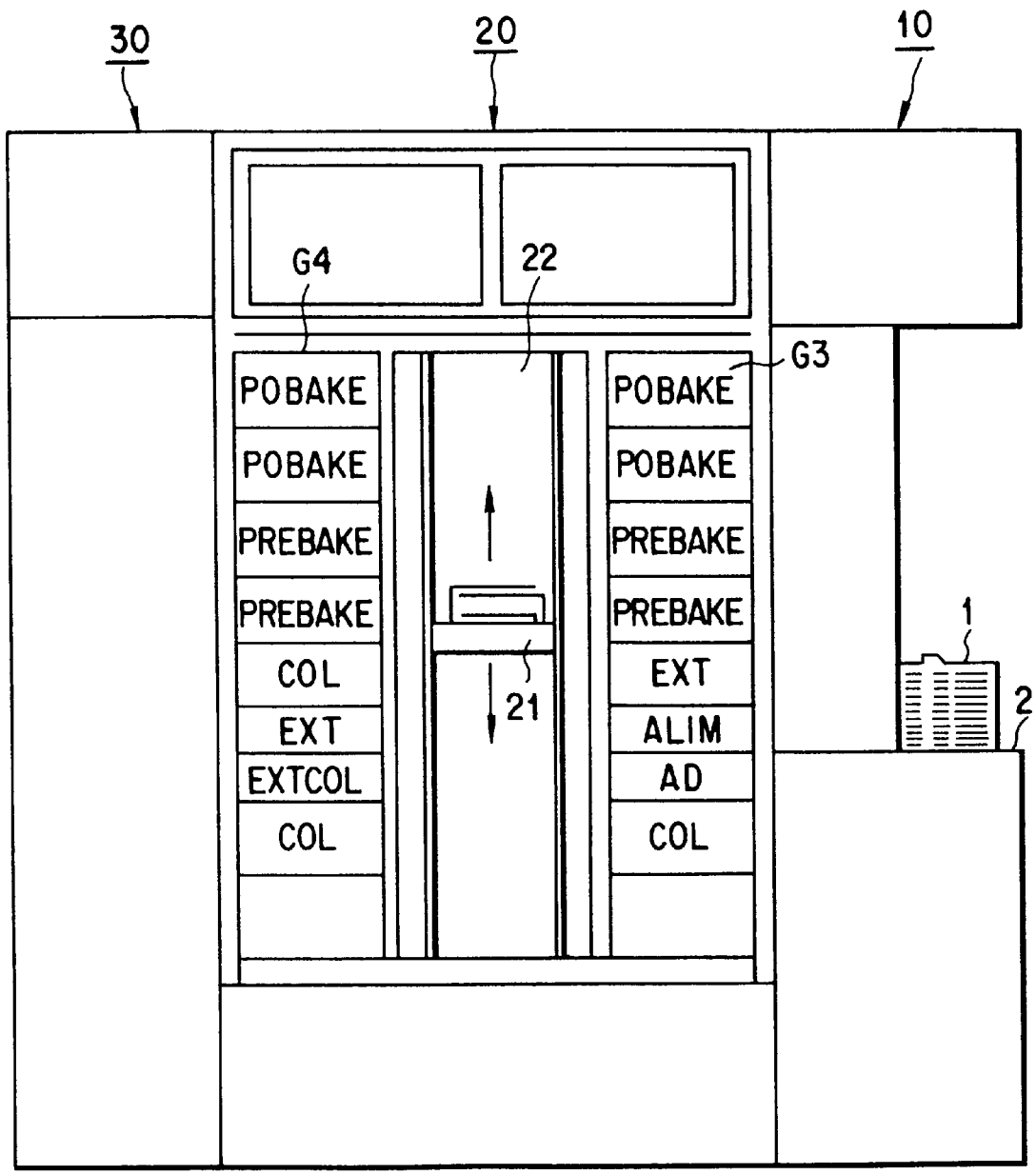
FIG. 3 is a rear view of the resist liquid coating/developing system shown in FIG. 1.

FIG. 1 is a schematic plan view showing a resist liquid coating/developing process system for a semiconductor wafer, which system comprises a processing apparatus according to an embodiment of the present invention. FIG. 2 is a front view of the resist liquid coating/developing system shown in FIG. 1, and FIG. 3 is a rear view of the resist liquid coating/developing system shown in FIG. 1.

This process system comprises a cassette station 10, a process station 20 having a plurality of process units, and an interface section 30 for transferring wafers W between the process station 20 and an exposure device (not shown) provided adjacent to the interface section 30.

The cassette station 10 transfers, between the present system and another system, semiconductor wafers W as objects to be processed, which are placed in a wafer cassette 1 in units of, e.g. 25 wafers. In addition, the cassette station 10 transfers the wafers W between the wafer cassette 1 and process station 20.

In the cassette station 10, as is shown in FIG. 1, a plurality of (four, in FIG. 1) projections 3 are formed on a cassette table 2 in a direction X in FIG. 1. Wafer cassettes 1 can be positioned linearly at the projections 3, with wafer inlets/outlets facing the process station 20. Wafers W are arranged vertically (direction Z) in the wafer cassette 1. The cassette station 10 has a wafer transfer mechanism 4 situated between the wafer cassette table 2 and process station 20. The wafer transfer mechanism 4 has a wafer transfer arm 4a movable in the direction of arrangement of cassettes (direction X) and in the direction of arrangement of wafers W in the cassette (direction Z). The arm 4a can selectively access any one of the wafer cassettes 1. The wafer transfer arm 4a is rotatable in a θ direction and can transfer wafers W between an alignment unit (ALIM) and an extension unit (EXT) belonging to a group G3 (to be described later) on the process station (20) side.

The process station 20 comprises a plurality of process units for carrying out a series of steps for coating and developing a resist on semiconductor wafers W. These process units are arranged in multiple stages at predetermined positions. Thereby, the semiconductor wafers W are processed one by one. As is shown in FIG. 1, a vertically movable main wafer transfer mechanism 21 is provided in a central part of the process station 20. All process units are disposed around the wafer transfer space 22 of main wafer transfer mechanism 21. These process units are divided into a plurality of groups, and each process unit group consists of process units arranged in multiple stages. In this embodiment, five process unit groups G1, G2, G3, G4 and G5 are disposed around a wafer transfer space 22, such that the wafer transfer space 22 is substantially closed.

Of the five groups, the groups G1 and G2 are juxtaposed on the front side of the system (i.e. on the viewer's side of FIG. 1). The group G3 is provided adjacent to the cassette station 10, the group G4 is provided adjacent to the interface section 30, and the group G5 is provided on the rear side of the system.

In the group G1, as shown in FIG. 2, two spinner type process units are vertically arranged. These process units perform predetermined processes for wafers W placed on spin chucks (not shown) in cups 23. In this embodiment, a resist coating unit (COT) for coating a resist on the wafer W is situated below, and a development unit (DEV) for developing a pattern on the resist is situated above. Similarly, in the group G2, a resist coating unit (COT) is situated below and a development unit (DEV) is situated above, as two spinner type process units. The reason why the resist coating unit (COT) is situated below is that a waste of the resist liquid is fundamentally more complex than a waste of development liquid, from aspects of structure and maintenance. By situating the coating unit (COT) below, the complexity is relaxed. It is possible, however, to situate the resist coating unit (COT) above, on an as-needed basis.

The group G3, as shown in FIG. 3, comprises oven-type process units for subjecting wafers W placed on a mount table 24 (see FIG. 1) to predetermined processes. The process units are arranged vertically, for example, in eight stages. For example, the process units comprise a cooling unit (COL) for cooling wafers, an adhesion unit (AD) for subjecting wafers to an adhesion process, an alignment unit (ALIM) for aligning wafers, an extension unit (EXT) for transfer of wafers, prebaking units (PREBAKE) for prebaking wafers, and postbaking units (POBAKE) for postbaking wafers. These eight units are arranged successively upward. Similarly, the group G4 comprises oven-type process units, e.g. a cooling unit (COL), an extension/cleaning unit (EXTCOL), an extension unit (EXT), a cooling unit (COL), two prebaking units (PREBAKE) and two postbaking units (POBAKE). These eight units are arranged successively upward.

Since the cooling unit (COL) and extension/cooling unit (EXTCOL) with low process temperatures are arranged in lower stages and the prebaking units (PREBAKE), postbaking units (POBAKE) and adhesion unit (AD) are arranged in upper stages, thermal interference among the units can be reduced. Needless to say, however, other arrangement may be adopted.

The group G5 situated on the rear side of the main wafer transfer mechanism 21 has basically the same structure as the groups G3 and G4. The group G5 is movable along guide rails 67 in a lateral direction of the main wafer transfer mechanism 21. Accordingly, an empty space is provided by sliding the group G5, so that maintenance works for the main wafer transfer mechanism 21 may be easily performed on the rear side thereof.

The interface section 30 has the same length in the direction X as the process station 20. As is shown in FIGS. 1 and 2, a movable pickup cassette 31 and a stationary buffer cassette 32 are arranged in two stages in a front part of the interface section 30. A peripheral exposure device 33 is provided in a rear part of the interface section 30. A wafer transfer arm 34 is provided in a central part of the interface section 30. The wafer transfer arm 34 is movable in the directions X and Z and can transfer wafers W to the both cassettes 31 and 32 and peripheral exposure device 33. In addition, the wafer transfer arm 34 is rotatable in the θ direction and can transfer wafers W to the extension unit (EXT) in the group G4 on the process station (20) side and to an adjacent wafer transfer table (not shown) on the exposure device side.

Figure 4:
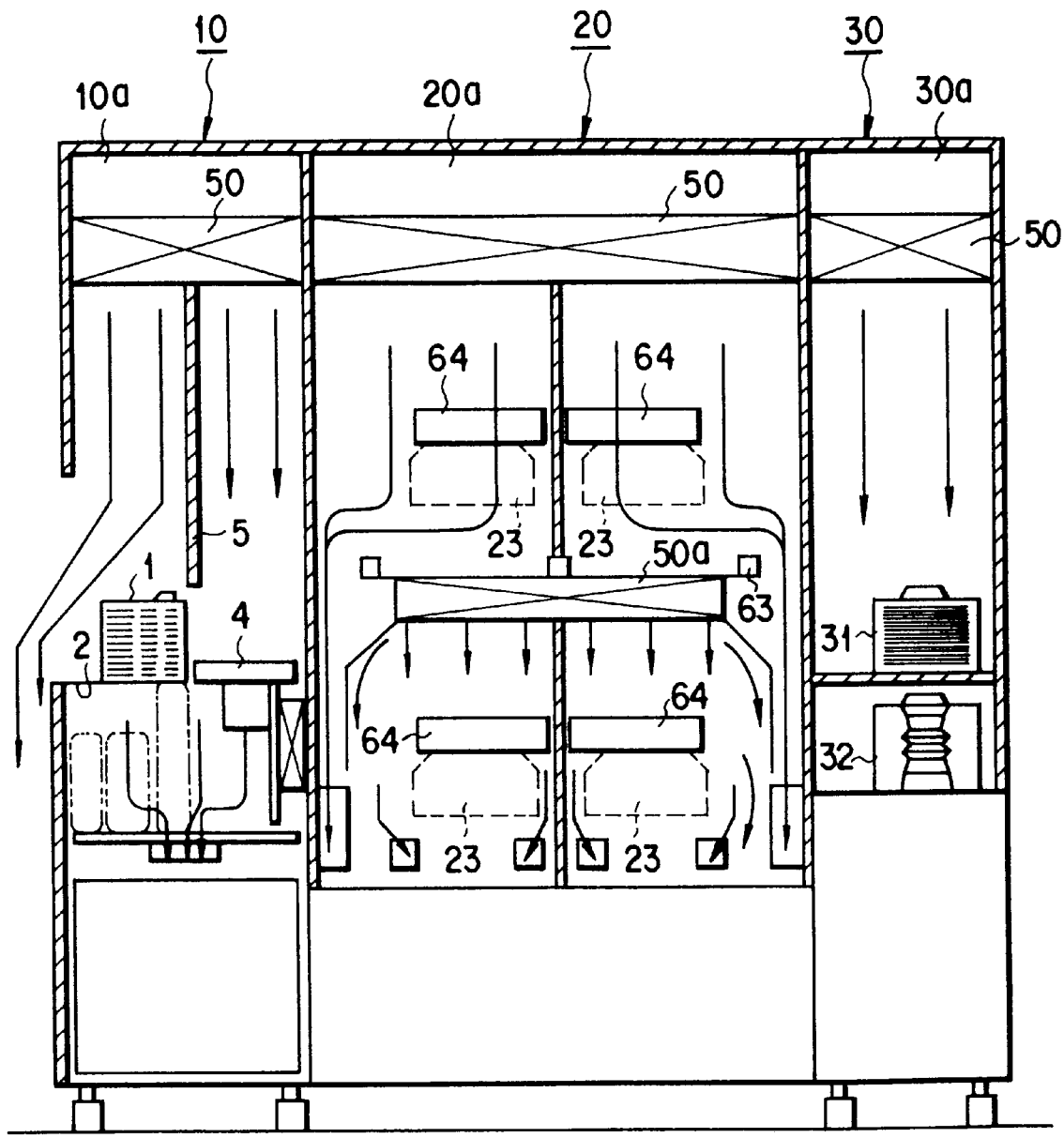
FIG. 4 is a schematic front view illustrating the flow of cleaning air in the resist liquid coating/developing system shown in FIG. 1.

The process system having the above structure is situated within a clean room, thereby enhancing the cleanness thereof. Furthermore, a vertical laminar air flow is let to flow within the system, thus further enhancing the cleanness of the respective parts of the system. FIGS. 4 and 5 illustrate the flow of cleaning air within the system.

As is shown in FIG. 4, air supply chambers 10a, 20a and 30a are provided above the cassette station 10, process station 20 and interface section 30. Dustproof filters, e.g. ULPA filters 50, are attached to bottom surfaces of the air supply chambers 10a, 20a and 30a. Air is introduced into the air supply chambers 10a and 30a via branch pipes (not shown) connected to an air introducing or air circulation pipe 52 on which an air feed fan (air feed means) 51 (described later) is provided. The introduced air flows through the ULPA filters 50 and clean air flows downward into the cassette station 10 and interface section 30.

As is shown in FIG. 5, an air inlet 25 for supplying air to the wafer transfer space 22 of main wafer transfer mechanism 21 is provided above the wafer transfer space 22. An exhaust port 26 for exhausting air from the wafer transfer space 22 is provided below the wafer transfer space 22. The air introducing pipe 52 is connected between the air inlet 25 and exhaust port 26, and air circulates through the pipe 52.

The air supply chamber 20 is provided between the air inlet 25 and pipe 52. The ULPA filter 50 is attached to the bottom of the chamber 20. A chemical filter 53 having a function of removing organic contaminants such as amine is provided above the air supply chamber 20.

An exhaust chamber 20b is provided at a connection portion between the exhaust port 26 and circulation pipe 52. A porous plate 54 provided with the exhaust port 26 is attached to the top of the exhaust chamber 20b. An exhaust fan 55 is provided within the exhaust chamber 20b. Pressure adjusting means or a slit damper 56 is provided at a connection part between the exhaust chamber 20b and circulation pipe 52.

As is shown in FIGS. 6A and 6B, the slit damper 56 comprises a stationary porous plate 56b having a number of air passage holes 56a, and a movable porous plate 56b situated horizontally movable under the stationary porous plate 56b and provided with a number of adjustment holes 56c which can be aligned with the associated air passage holes 56a. The movable porous plate 56b is horizontally moved by proper reciprocal drive means, e.g. a cylinder mechanism or a timing belt mechanism, so that the area of opening defined by the holes 56a and 56c is adjusted and the quantity of flowing air is controlled. Thus, the pressure within the wafer transfer space 22 is adjusted. Specifically, the pressure P1 within the wafer transfer space can be set at a positive pressure level, that is, a predetermined pressure level higher than pressure P2 within the clean room by, e.g. 0.1 mmH$_2$O.

The pressure adjusting means is not limited to the slit damper and may be any means capable of adjusting the area of passage of air exhausted from the transfer space 22.

On the other hand, an outside air introducing pipe 57 for introducing outside air is provided on the circulation pipe 52 between the air feed fan 51 and slit damper 56. A damper 58 serving as air quantity adjusting means is disposed in the pipe 57. The air feed fan 51 is driven and damper 58 is opened at a predetermined degree of opening, whereby the outside air, i.e. cleaning air in the clean room 40, is taken in through the outside air introducing pipe 57 and supplied into the transfer space 22 via the pipe 52. Accordingly, outside air is supplied from the outside air introducing pipe by a quantity corresponding to the quantity of that portion (e.g. 0.1 to 0.3 m/sec) of the cleaning air (e.g. 0.3 to 0.5 m/sec) supplied into the transfer space 22, which has been lost by each process unit.

The damper 58 used as air quantity adjusting means may be replaced with other means such as a flow control valve.

A temperature controller 59 serving as temperature control means is provided on the circulation pipe 52 between the air feed fan 51 and air supply chamber 20a. The temperature controller 59 maintains the temperature of cleaning air supplied to the wafer transfer space 22 at a predetermined level, e.g. 23° C. Although not shown, proper means for humidity control may be provided on the pipe 52, thereby to maintain the humidity in the wafer transfer space 22 at a predetermined level.

The slit damper 56, damper 58 and temperature controller 59 having the above structures are controlled by control signals from a CPU (Central Processing Unit) 60 functioning as control means. Specifically, a sense signal from a pressure/air quantity sensor 61 provided on the air inlet (25) side in the wafer transfer space 22 is delivered to the CPU 60. The sense signal is compared with information prestored in the CPU 60. A control signal obtained by the comparison is sent to the slit damper 56 and damper 58. Thus, the pressure in the wafer transfer space 22 and the quantity of cleaning air to be supplied are controlled at predetermined values.

Besides, a temperature signal obtained by a temperature sensor 62 disposed in the lower part of the wafer transfer space 22 is sent to the CPU 60. The temperature signal is compared with information prestored in the CPU 60, and an obtained control signal is transmitted to the temperature controller 59. Thus, the temperature of cleaning air flowing through the pipe 52 is controlled at, e.g. 23° C., and the cleaning air at this temperature is supplied to the wafer transfer space 22. Accordingly, the conditions of the wafer transfer space 22, i.e. pressure, air quantity and temperature, can be controlled at predetermined values at all times, and each process performed in the process system in good conditions. Furthermore, the cleaning air, which is supplied to the wafer transfer space 22, does not flow out of the process system, i.e. to the clean room. Particles, organic contaminants, etc. produced in the process system do not flow to the clean room.

In the cassette station 10, as shown in FIG. 4, the space above the cassette table 2 is divided from the space for movement of the wafer transfer mechanism 4 by means of a vertically extending partition plate 5 pending from the ceiling of the station 10. Thus, downward air flows are supplied separately in both spaces.

In the process station 20, as shown in FIGS. 4 and 5, a ULPA filter 50a is disposed on the ceilings of the resist coating units (COT) arranged in the lower stages of the process unit groups G1 and G2. The air supplied to the chamber 22 from the circulation pipe 52 flows into the resist coating units (COT) via the ULPA filter 50a. In this case, an output from a temperature/humidity sensor 63, provided near the blow-out side of the ULPA filter 50a, is sent to the CPU 60, and the temperature and humidity of the cleaning air is exactly controlled in a feedback manner.

As is shown in FIG. 4, an opening 64 for passage of the wafers W and transfer arm is formed in a side wall of each spinner type process unit (COT), (DEV), which faces the main wafer transfer mechanism 21. Each opening 64 is provided with a shutter (not shown) for preventing particles, organic contaminants, etc. from entering from each unit into the region of the main wafer transfer mechanism 21.

In the process station 20, as is shown in FIG. 1, vertically extending ducts 65 and 66 are provided inside the side walls of the process unit groups G3 and G4 comprising the oven-type process units, which respectively adjoin the process unit groups G1 and G2 comprising the spinner-type process units. Cleaning air or specially temperature-conditioned air flows downward through the ducts 65 and 66. By virtue of the ducts, heat produced in the groups G3 and G4 is insulated from the spinner-type process units of the groups G1 and G2.

Figure 7:
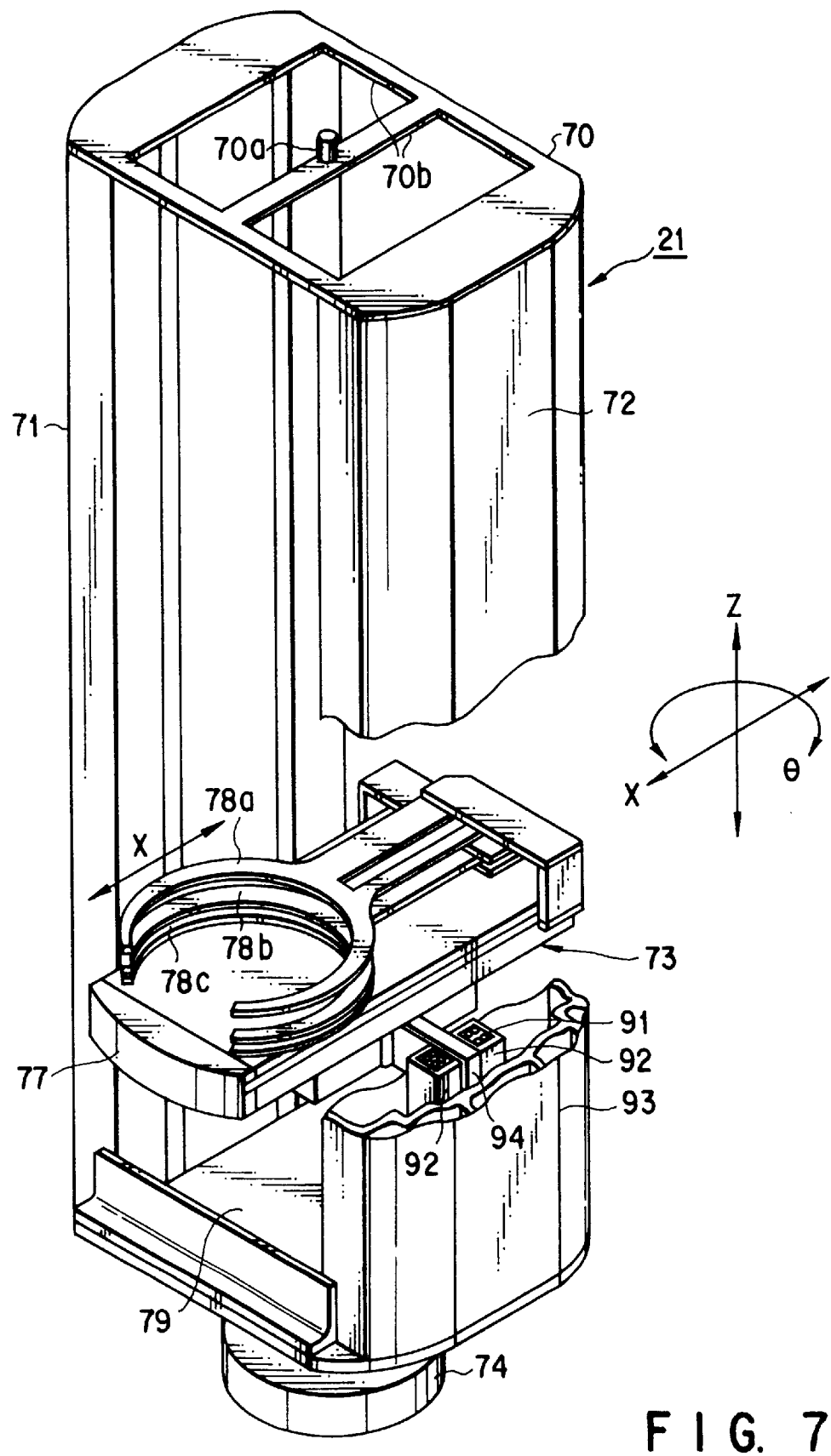
FIG. 7 is a perspective view schematically showing a main wafer transfer mechanism in the processing apparatus according to the embodiment as applied to the system shown in FIG. 1.
Figure 9:
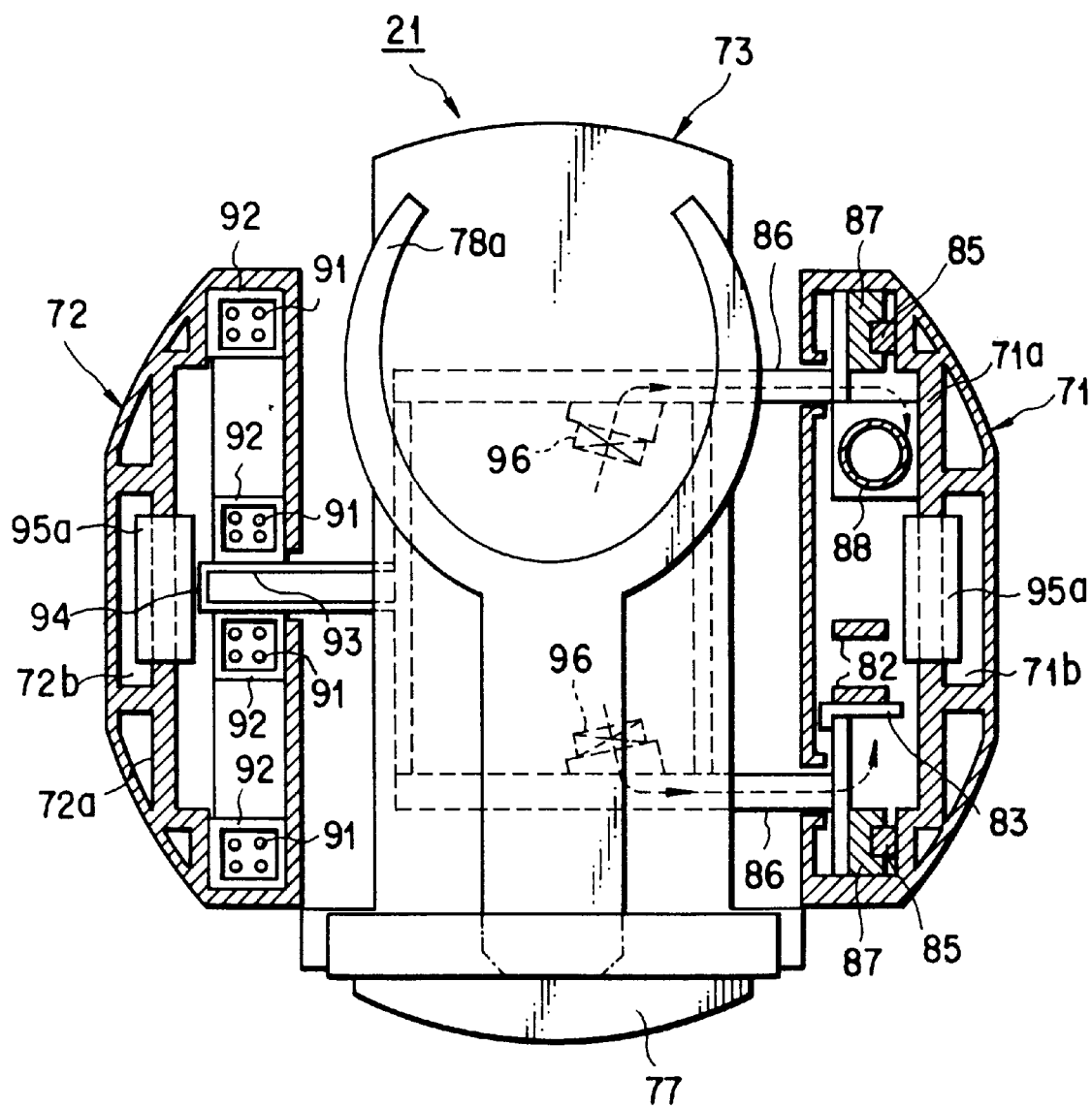
FIG. 9 is a cross-sectional plan view showing the main wafer transfer mechanism, as viewed in the direction of arrow A in FIG. 8.
Figure 10:
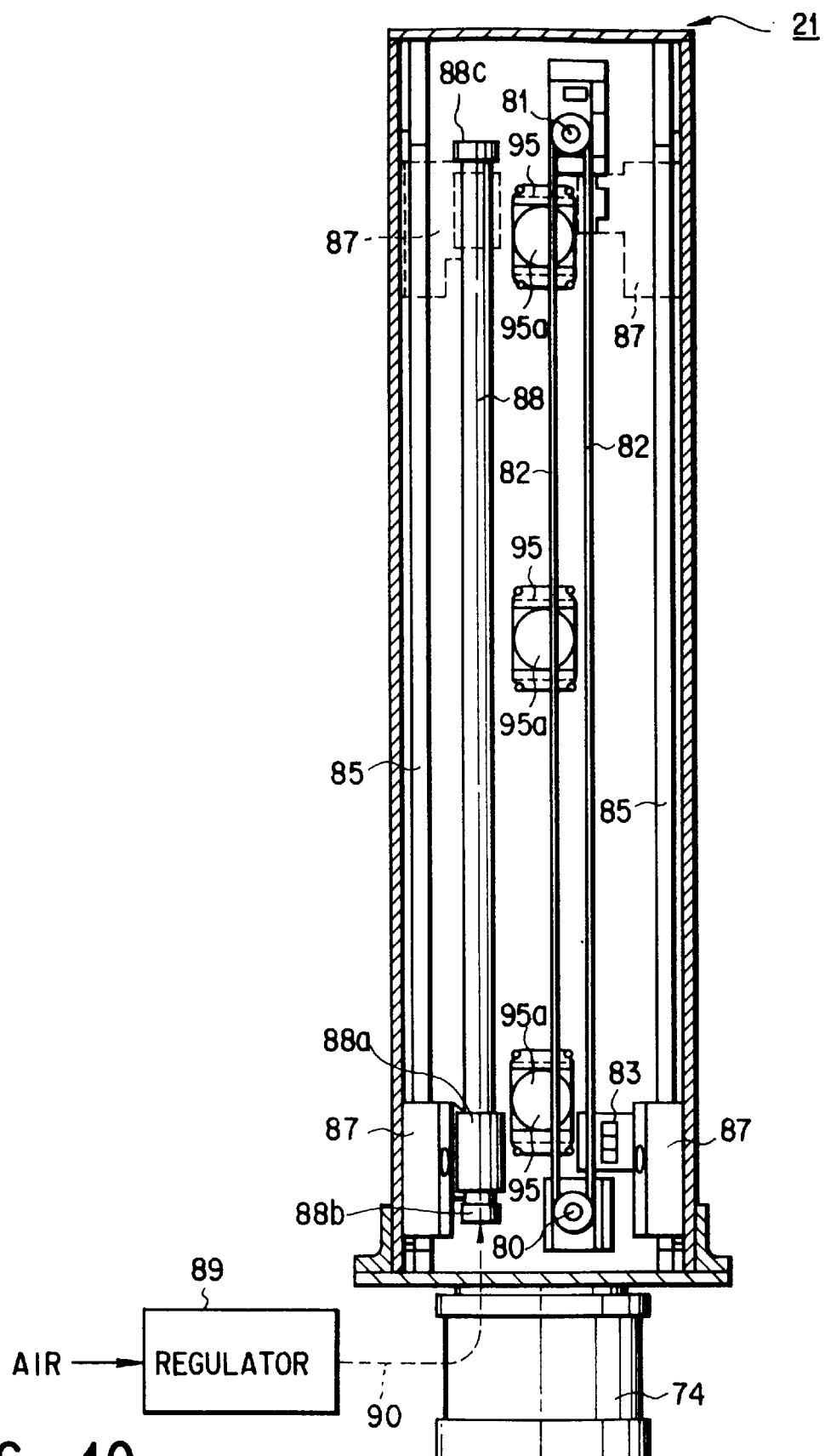
FIG. 10 is a side view showing the inside of the main wafer transfer mechanism, as viewed in the direction of arrow B in FIG. 8.
Figure 11:
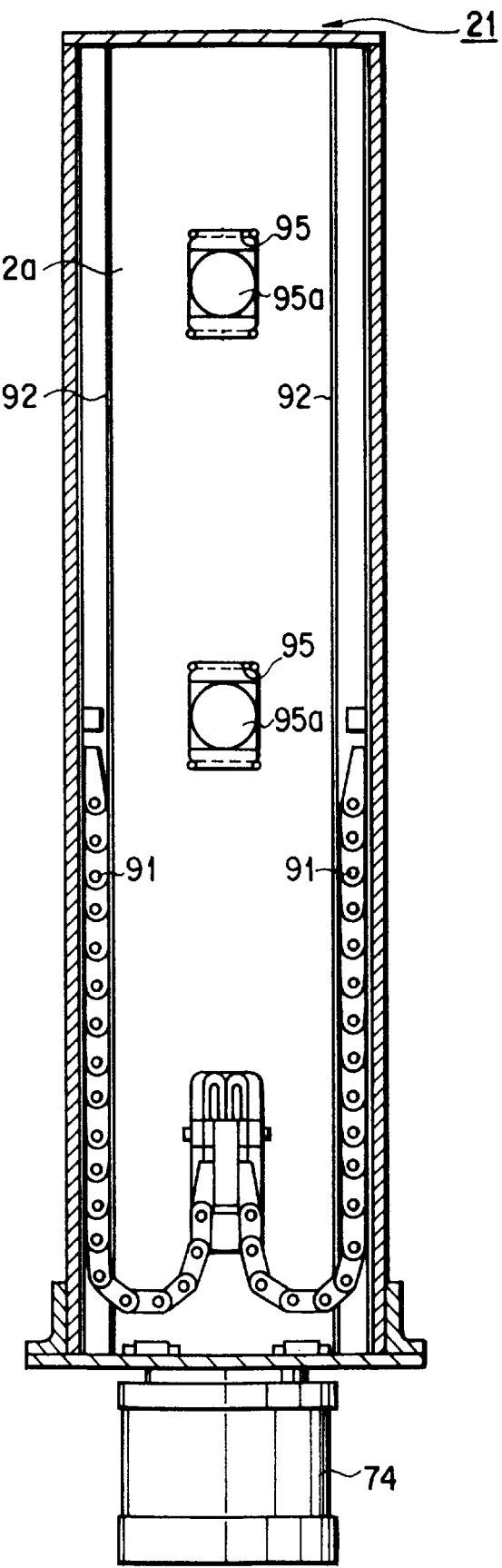
FIG. 11 is a side view showing the inside of the main wafer transfer mechanism, as viewed in the direction of arrow C in FIG. 8.

The structure and function of the main wafer transfer mechanism 21 in the process station 20 will now be described with reference to FIGS. 7 through 11. FIG. 7 is a perspective view schematically showing the structure of a main part of the main wafer transfer mechanism 21, FIG. 8 is a vertical cross-sectional view showing the structure of the main part of the main wafer transfer mechanism 21, FIG. 9 is a cross-sectional plan view showing the main wafer transfer mechanism 21, as viewed in the direction of arrow A in FIG. 8, FIG. 10 is a side view showing the inside of the main wafer transfer mechanism 21, as viewed in the direction of arrow B in FIG. 8, and FIG. 11 is a side view showing the inside of the main wafer transfer mechanism 21, as viewed in the direction of arrow C in FIG. 8.

Figure 8:
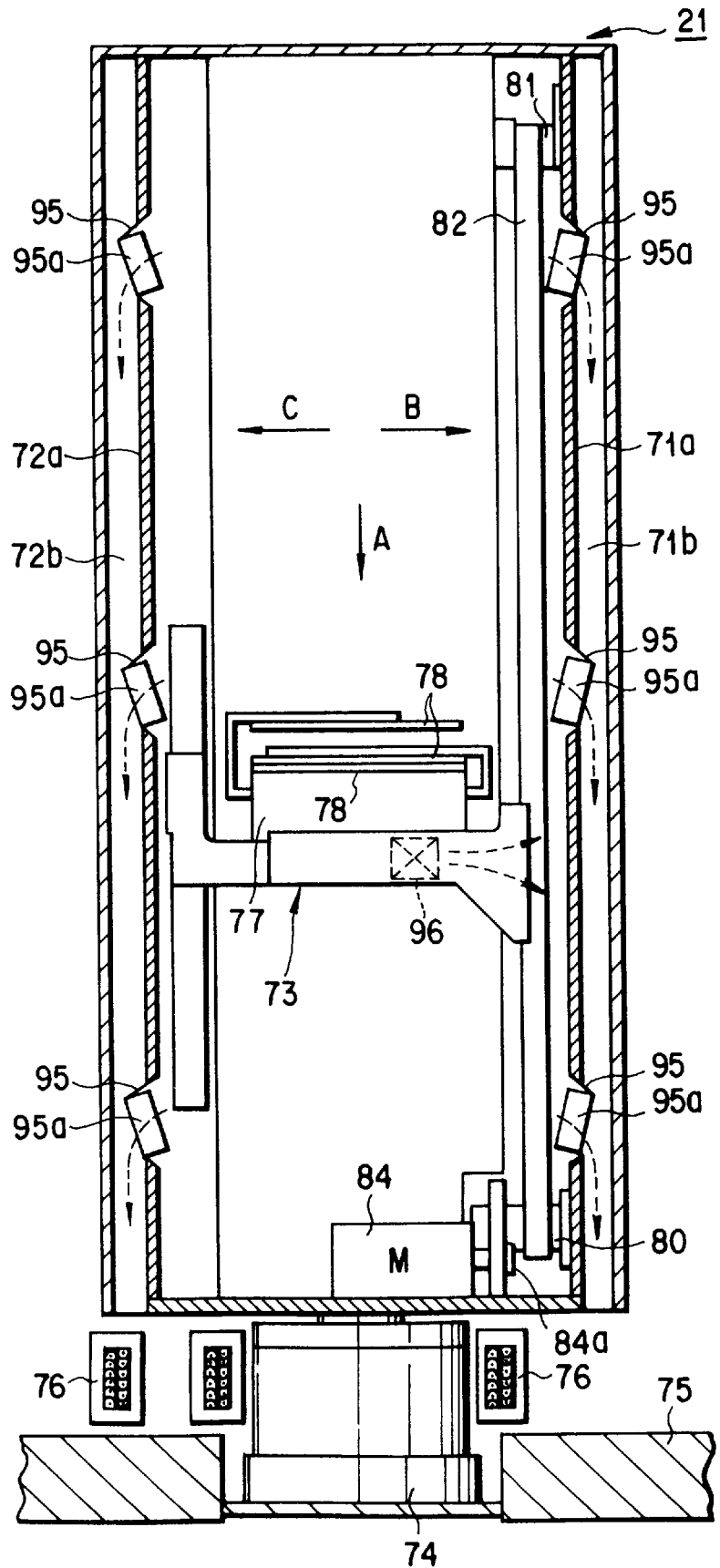
FIG. 8 is a vertical cross-sectional view showing the structure of a main part of the main wafer transfer mechanism shown in FIG. 7.

As is shown in FIGS. 7 and 8, the main wafer transfer mechanism 21 has a columnar support body 70 comprising a pair of mutually facing vertical wall portions 71 and 72 coupled to each other at their upper and lower ends. A wafer transfer member 73 is disposed inside the support body 70 so as to be vertically movable (in direction Z). The columnar support member 70 is coupled to a rotary shaft of a rotational drive motor 74. When the motor 74 is actuated, the support body 70 rotates on the rotary shaft along with the wafer transfer member 73. The motor 74 is fixed to a base plate 75 of the process system, and a flexible cable 76 for supplying power is wound around the motor 74. The columnar support body 70 may be attached to another rotary shaft (not shown) rotated by the motor 74.

The range of vertical movement of the wafer transfer body 73 is set such that wafers W can be transferred by the wafer transfer member 73 to all the process unit groups G1 to G5. The wafer transfer member 73 comprises three support forks 78a, 78b and 78c movable in the direction X (i.e. back-and-forth direction) provided on a transfer base 77. Each support fork can pass through a side opening between both vertical wall portions 71 and 72 of the columnar support body 70. An X-directional drive unit for moving each support fork in the direction X includes a drive motor and a belt (not shown) built in the transfer base 77.

The uppermost fork 78a of the three forks may be used exclusively for transferring cooled wafers W. In addition, heat-insulating plates may be provided among forks to prevent thermal interference.

As is shown in FIGS. 8 to 10, a pair of pulleys 80 and 81 are provided at an upper and a lower end region of a substantially central part of the inside of one of the vertical wall portions, 71. A vertical drive endless belt 82 is passed between the pulleys 80 and 81. The transfer base 77 of the wafer transfer member 73 is coupled to the vertical drive belt 82 by means of a belt clamp 83. The lower pulley 80, functioning as drive pulley, is coupled to a drive shaft 84a of drive motor 84 fixed on the bottom of columnar support member 70.

As is shown in FIGS. 9 and 10, a pair of guide rails 85 are vertically arranged on right and left end portions of the inside of the vertical wall portion 71. Sliders 87, which are provided at distal end portions of a pair of horizontal support rods 86 projected from the side faces of the transfer base 77, are slidably engaged with the guide rails 85, respectively. The wafer transfer member 73 can be vertically moved by the drive force of the motor 84 by means of these vertical belt drive mechanism and vertical slider mechanism.

In addition, as shown in FIGS. 9 and 10, a rodless cylinder 88 is vertically provided between a central region of the inside of the vertical wall portion 71 and one of the guide rails 85. A cylindrical movable member 88a is slidably provided on the rodless cylinder 88. The cylindrical movable member 88a is coupled to the transfer base 77 of wafer transfer member 73 by means of a horizontal support rod 86. Since the movable member 88a is magnetically coupled to a piston (not shown) slidably inserted in the cylinder 88, the wafer transfer member 73 and the piston can be simultaneously moved by means of the movable member 88a. Compressed air is supplied from a regulator 89 into the cylinder 88 via a lower-end port 88b. The pressure of the compressed air corresponds substantially to the weight of the wafer transfer member 73. An upper-end port 88c of the cylinder 88 is opened to the outside.

Since the weight of the wafer transfer member 73 is canceled by the lifting force acting within the cylinder 88, the wafer transfer member 73 can be vertically moved at high speed, without being influenced by the gravity of the wafer transfer member 73. Moreover, even if the drive belt 82 is cut, the wafer transfer member 73 is kept in its position by the lift acting in the cylinder 88 and is prevented from falling due to its weight. Therefore, there is no concern that the wafer transfer member 73 or columnar support body 70 is broken.

As is shown in FIGS. 7, 9 and 11, four sleeves 92, in which flexible cables 91 for supplying power and control signals to the wafer transfer member 73 are vertically extended, are provided in a central region and both side regions of the inside of the vertical wall portion 72. A vertical guide 93 is defined between mutually facing side surfaces of the two sleeves 93 provided in the central region. A slider 94 projecting from the side face of the transfer base 77 is guided by the vertical guide 93.

As is shown in FIG. 10, a pair of openings 70b are formed in an upper surface of the columnar support body 70 on both sides of a rotational shaft 70a. The above-mentioned downward cleaning air flows into the main wafer transfer mechanism 21 via the openings 70b. The space for vertical movement of the wafer transfer member 73, i.e. the wafer transfer space 22, is kept clean at all times by the downward cleaning air.

As is shown in FIG. 9, vertical partition plates 71a and 72a are provided inside both vertical wall portions 71 and 72. Ducts 71b and 72b are defined by the rear surfaces of the vertical partition plates 71a and 72b and the vertical wall portions 71 and 72. The ducts 71b and 72b communicate with the inside spaces of the vertical wall portions 71 and 72 via a plurality of exhaust ports 95 and fans 95a provided on the vertical partition plates 71a and 72a at predetermined intervals. Thereby, dust produced from the movable members such as vertical drive belt 82, rodless cylinder 88 and cables 91 is exhausted to the ducts 71b and 72b by the fans 95. In this case, the exhausting operation is enhanced by providing the lowermost fans with maximum quantities of exhaust air.

In the wafer transfer member 73, too, as shown in FIGS. 8 and 9, the inside space of the transfer base 77 communicates with the inside spaces of the vertical wall portions 71 and 72 via fans 96 and the inner hole of the horizontal support rod 86. Thereby, dust produced from the fork drive motor, belt, etc. built in the transfer base 77 can be exhausted to the dusts 71b and 72b.

In addition, a temperature signal obtained by the temperature sensor 62 disposed in the lower region of the wafer transfer space 22 is sent to the CPU 60. The temperature signal is compared with information prestored in the CPU 60, and the obtained control signal is sent to the temperature controller 59. Thus, the cleaning air flowing in the pipe 52 is controlled at a predetermined temperature of, e.g. 23° C., and the cleaning air at this temperature is fed into the wafer transfer space 22.

Accordingly, the conditions of the wafer transfer space 22, i.e. pressure, air quantity and temperature, can be controlled at predetermined values at all times, and each process performed in the process system in good conditions. Furthermore, the cleaning air, which is supplied to the wafer transfer space 22, does not flow out of the process system, i.e. to the clean room. Particles, organic contaminants, etc. produced in the process system do not flow to the clean room.

A description will now be given of a wafer transfer operation while wafers W are subjected to a series of processes in the above-described process system.

In the cassette station 10, the wafer transfer arm 4a of wafer transfer mechanism 4 accesses the cassette 1 containing non-processed wafers W and takes out one of wafers W from the cassette 1.

The wafer transfer arm 4a transfers the wafer W, taken out of the cassette 1, to the alignment unit (ALIM) disposed in the process unit group G3 on the process station (20) side and places the wafer W onto the wafer mount table 24 in the alignment unit (ALIM). Then, the wafer W on the wafer mount table 24 is aligned with reference to the orientation flat and centered. Thereafter, the wafer transfer member 73 of main wafer transfer mechanism 21 receives the wafer W from the wafer mount table 24 on the opposite side of the alignment unit (ALIM).

In the process station 20, the main wafer transfer mechanism 21 transfers first the wafer W to the adhesion unit (AD) of the process unit group G3. In the adhesion unit (AD), the wafer W is subjected to an adhesion process. After the adhesion process is completed, the main wafer transfer mechanism 21 transfers the wafer W from the adhesion unit (AD) to the cooling unit (COL) of the process unit group G3 or the cooling unit (COL) of the process unit group G4. In the cooling unit (COL), the wafer is cooled down to a predetermined temperature, e.g. 23° C., prior to a resist coating process.

After the cooling process is completed, the wafer W is carried out of the cooling unit (COL) by the fork 78a of main wafer transfer mechanism 21 and transferred to the resist coating unit (COT) of the process unit group G1 or to the resist coating unit (COT) of the process unit group G2. In the resist coating unit (COT), a resist is coated on the surface of the wafer W to a uniform thickness by a spin coat method.

After the resist coating process is completed, the main wafer transfer mechanism 21 transfers the wafer W from the resist coating unit (COT) to the prebaking unit (PREBAKE) of the process unit group G3 or to the prebaking unit (PREBAKE) of the process unit group G4. In the prebaking unit (PREBAKE), the wafer W is placed on a heat plate (not shown) and heated at a predetermined temperature, e.g. 100° C., for a predetermined time period. Thereby, a residual solvent is evaporated and removed from the coated film on the wafer W. After the prebaking process is completed, the main wafer transfer mechanism 21 transfers the wafter W from the prebaking unit (PREBAKE) to the extension/cooling unit (EXTCOL) of the process unit group G4. In the extension/cooling unit (EXTCOL), the wafer W is cooled down to a temperature, e.g. 24° C., at which the next process, i.e. a peripheral exposure process in the peripheral exposure device 33, is preferably carried out.

Then, the main wafer transfer mechanism 21 transfers the wafer W to the extension unit (EXT) disposed immediately above, and places the wafer W on the mount table (not shown) therein. Once the wafer W has been placed, the wafer transfer arm 34 of the interface section 30 accesses and receives the wafer W on the opposite side. Then, the wafer transfer arm 34 carries the wafer W to the peripheral exposure device 33 in the interface section 30. In the peripheral exposure device 33, the edge portion of the wafer W is exposed.

After the peripheral exposure is completed, the wafer transfer arm 34 transfers the wafer W from the peripheral exposure device 33 to a wafer receiving table (not shown) on the adjacent exposure device side. Before the wafer W is transferred to the exposure device, the wafer W may be temporarily stored in the buffer cassette 32 if needs be.

The wafer W, after totally exposed in the exposure device, is restored to the wafer receiving table on the exposure device side. The wafer transfer arm 34 of interface section 30 accesses the wafer receiving table and receives the wafer W. The wafer transfer arm 34 then transfers the wafer W into the extension unit (EXT) of process unit group G4 of process station 20 and places the wafer W on the wafer receiving table. In this case, too, before the wafer W is transferred to the process station 20, the wafer W may be temporarily stored in the buffer cassette 32 in the interface section 30 if needs be.

Once the wafer W has been transferred to the extension unit (EXT), the main wafer transfer mechanism 21 accesses and receives the wafer W on the opposite side and transfers the wafer W to the development unit (DEV) of process unit group G1 or to the development unit (DEV) of process unit group G2. In the development unit (DEV), the wafer W is placed on a spin chuck, and a development liquid is supplied onto the entire resist on the surface of wafer W by, e.g. a spray method. After the development, the development liquid is removed from the wafer surface by a rinse liquid.

After the developing step is completed, the main wafer transfer mechanism 21 transfers the wafer W from the development unit (DEV) to the postbaking unit (POBAKE) of process unit group G3 or to the postbaking unit (POBAKE) of process unit group G4. In the postbaking unit (POBAKE), the wafer W is heated at, e.g. 100° C. for a predetermined time period. Thereby, the developed and swollen resist is solidified, and the chemical resistance thereof is enhanced.

After the postbaking is completed, the main wafer transfer mechanism 21 transfers the wafer W from the postbaking unit (POBAKE) to either cooling unit (COL). In the cooling unit (COL), the temperature of the wafer W is cooled down to room temperature. The main wafer transfer mechanism 21 transfers the cooled wafer W to the extension unit (EXT) of process unit group G3. Once the wafer W has been placed on the table (not shown) of the extension unit (EXT), the wafer transfer arm 4a of cassette station 10 accesses and receives the wafer W on the opposite side. The wafer transfer arm 4a puts the received wafer W into a predetermined wafer containing groove in the cassette 1 for containing processed wafers, which is situated on the cassette mount table 2.

A single process is completed through the above series of steps.

As has been described above, in the system of the present embodiment, a plurality of process unit groups, each comprising a plurality of process units arranged in multiple stages, are disposed around the wafer transfer space 22 of the main wafer transfer mechanism 21. The wafer W is transferred by means of the main transfer mechanism 21 which is movable vertically and in the θ direction and which has a projectable/retractable fork. Thus, the wafer access time is reduced and the process time for all steps is remarkably reduced, resulting in a much higher throughput. In addition, the space occupied by the entire system can be reduced and accordingly the cost for the clean room can be decreased.

In addition, the cleaning air circulation system is adopted, whereby the cleaning air is supplied to the wafer transfer space 22 of the main wafer transfer mechanism 21 from the upper side and exhausted from the lower side. Thus, particles produced from the main wafer transfer mechanism 21 and organic contaminants produced from, e.g. the resist coating unit (COT), etc. do not flow to the clean room outside the process system. Accordingly, the cleanness of the clean room can be enhanced and the life of the clean room can be increased.

Additional cleaning air is supplied by adjusting the damper 58 of outside air introducing port 57, thereby replenishing the amount of cleaning air supplied to the wafer transfer space 22 and consumed by each unit. Thus, a fixed quantity of cleaning air can be supplied to the wafer transfer space 22 at all times. In addition, the inside of the wafer transfer space 22 can be maintained at a predetermined positive pressure level with respect to the clean room 40, by controlling the passage of air by means of the slit damper 56 provided on the pipe 52 constituting the circulation passage. The temperature of the cleaning air supplied to the wafer transfer space 22 can be kept at a predetermined temperature, e.g. 23° C., by means of the temperature controller 59 provided on the pipe 52 constituting the circulation passage. Accordingly, the conditions of the wafer transfer space 22, i.e. pressure, air quantity and temperature, can be controlled at predetermined values at all times, and each process performed in the process system in good conditions.

Another embodiment of the present invention will now be described.

The basic structure of a resist coating/developing system according to this embodiment is the same as that of the preceding embodiment. In this embodiment, however, the structure of the main wafer transfer mechanism differs from that of the main wafer transfer mechanism in the preceding embodiment, as will be described below. In this embodiment, a main wafer transfer mechanism 21' having a cylindrical body 110 surrounding the transfer path of the transfer member 73 is provided within the wafer transfer space 22 (see FIG. 14).

Figure 13:
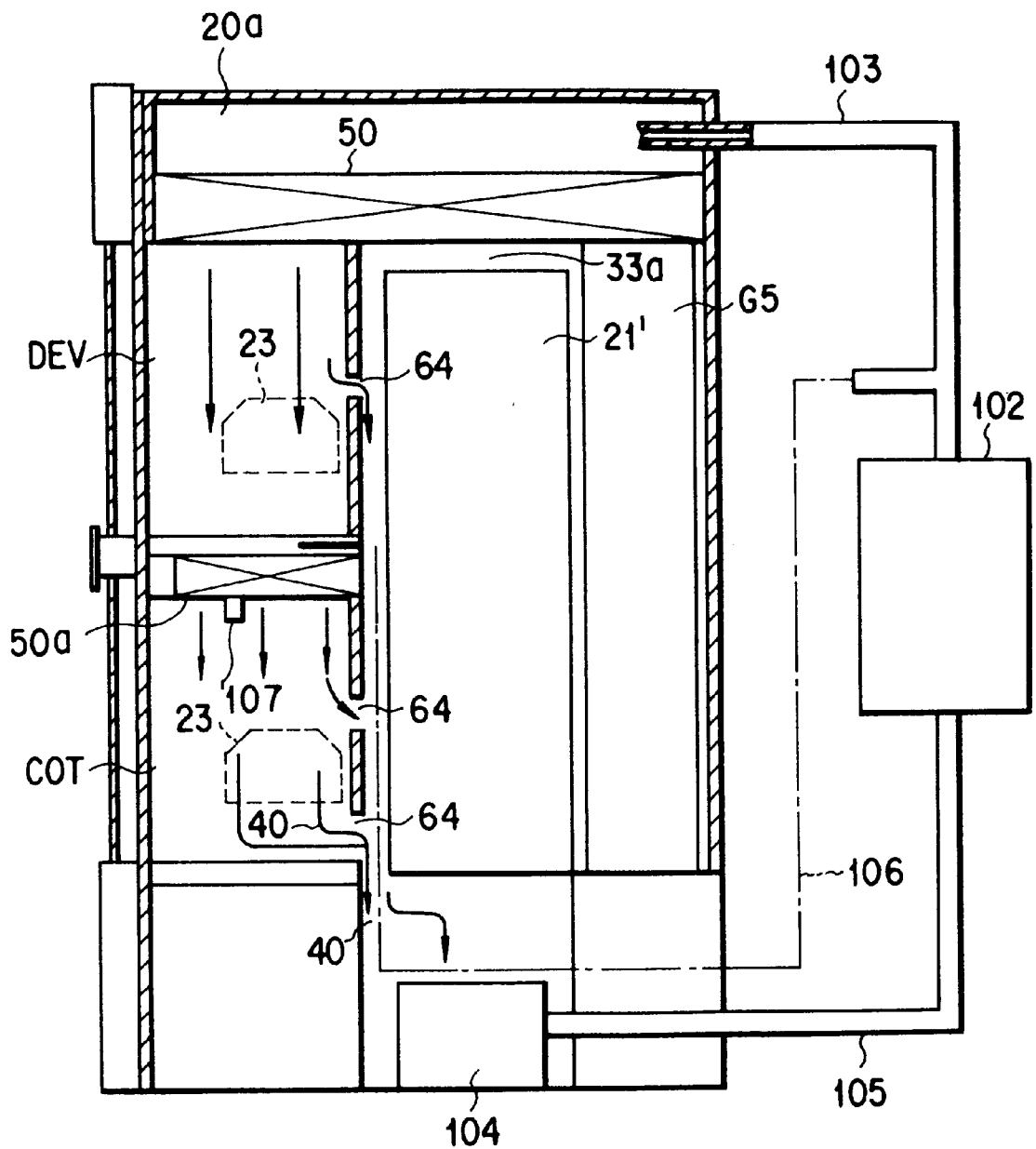
FIG. 13 is a side view schematically illustrating the flow of clean air in the process system shown in FIG. 12.

The system of this embodiment is also disposed in the clean room and thus the cleanness is enhanced. In addition, vertical layer flows are supplied efficiently in the system, and the cleanness of each section of the system is further enhanced. FIGS. 12 and 13 illustrate the flow of cleaning air in the system. In FIGS. 12 and 13, the structural parts common to those in the system of the preceding embodiment are denoted by like reference numerals.

In the present embodiment, as shown in FIG. 12, air supply chambers 10a, 20a and 30a are provided above the cassette station 10, process station 20 and interface section 30. Dust-proof filters, e.g. ULPA filters 50, are attached to the lower surfaces of the air supply chambers 10a, 20a and 30a. In addition, as shown in FIG. 13, an air conditioner 102 is provided outside the rear part of the process system of this embodiment. Air is fed from the air conditioner 102 to each air supply chamber 10a, 20a, 30a through a pipe 103. Clean air is fed downward to each station 10, 20, 30 from the ULPA filter 50 of each air supply chamber.

Downward flows of cleaning air are collected to an exhaust chamber 104 provided at the bottom via a number of air passage holes 40 formed at proper positions of the lower part of the system. The flows are then recovered to the air conditioner 102 from the exhaust chamber 104 via the pipe 105.

The air conditioner 102 may be provided at the upper part of the system in the case where the air supply chambers 10a, 20a and 30a are provided with fans.

In the process station 20, as is shown in FIG. 12, partition plates 33a are provided below the ULPA filter 50, which partition the space between the process unit group G3 and main wafer transfer mechanism 21' and the space between the process unit group G4 and main wafer transfer mechanism 21'. The group G3 side space and group G4 side space partitioned by the partition plates 33 communicate with ducts 33b provided in rear of the groups G3 and G4. Openings 33c are formed in duct (33b) side walls of the units of the process unit groups G3 and G4.

The cleaning air supplied to the ULPA filters 50 flows directly to the main wafer transfer mechanism 21' and also flows from the rear side of each unit toward the main wafer transfer mechanism 21' through the ducts 33b and openings 33c in the units. The cleaning air flows between the groups G3 and G4 and main wafer transfer mechanism 21' and passes through the passage holes 40.

In the process system of this embodiment, the cleaning air is let to flow from the rear side of each unit toward the main wafer transfer mechanism 21' through the openings 33c in the respective units. Thus, particles produced from the main wafer transfer mechanism 21' do not flow into the units. In addition, fresh cleaning air can be fed to the units arranged in multiple stages at all times.

As is shown in FIGS. 12 and 13, the ULPA filter 50a is provided at the ceiling of the resist coating units (COT) arranged in the lower stages in the process unit groups G1 and G2. Air from the air conditioner 102 flows to the filter 50a through a pipe 106 branched from the pipe 103. A temperature/humidity controller (not shown) is provided midway along the pipe 106. Thus, cleaning air having a predetermined temperature and humidity suitable for resist coating is fed to the two resist coating units (COT). A temperature/humidity sensor 107 is provided on the output side of the filter 50a, and a sensor output from the sensor 107 is delivered to a control unit of the temperature/humidity controller. Thus, the temperature and humidity of the cleaning air are exactly controller in a feedback manner.

In FIG. 13, openings 64 for passage of the wafers and transfer arm are formed in those side walls of the spinner type process units (COT) and (DEV), which face the main wafer transfer mechanism 21'. Each opening 64 is provided with a shutter (not shown) for preventing particles or contaminants from entering from each unit to the main wafer transfer mechanism 21'.

Figure 16:
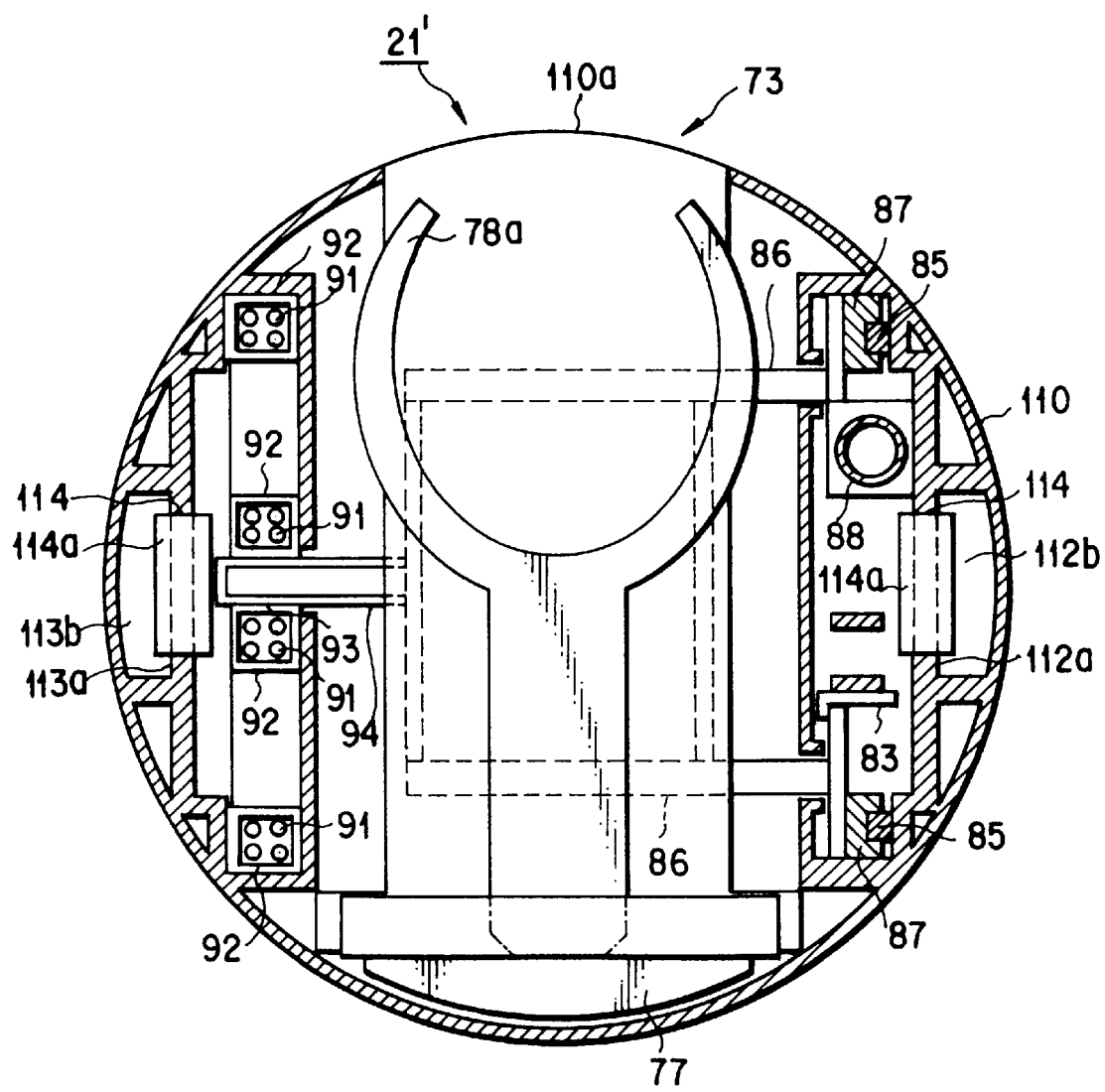
FIG. 16 is a cross-sectional plan view showing the main wafer transfer mechanism, as viewed in the direction of arrow A in FIG. 15.
Figure 17:
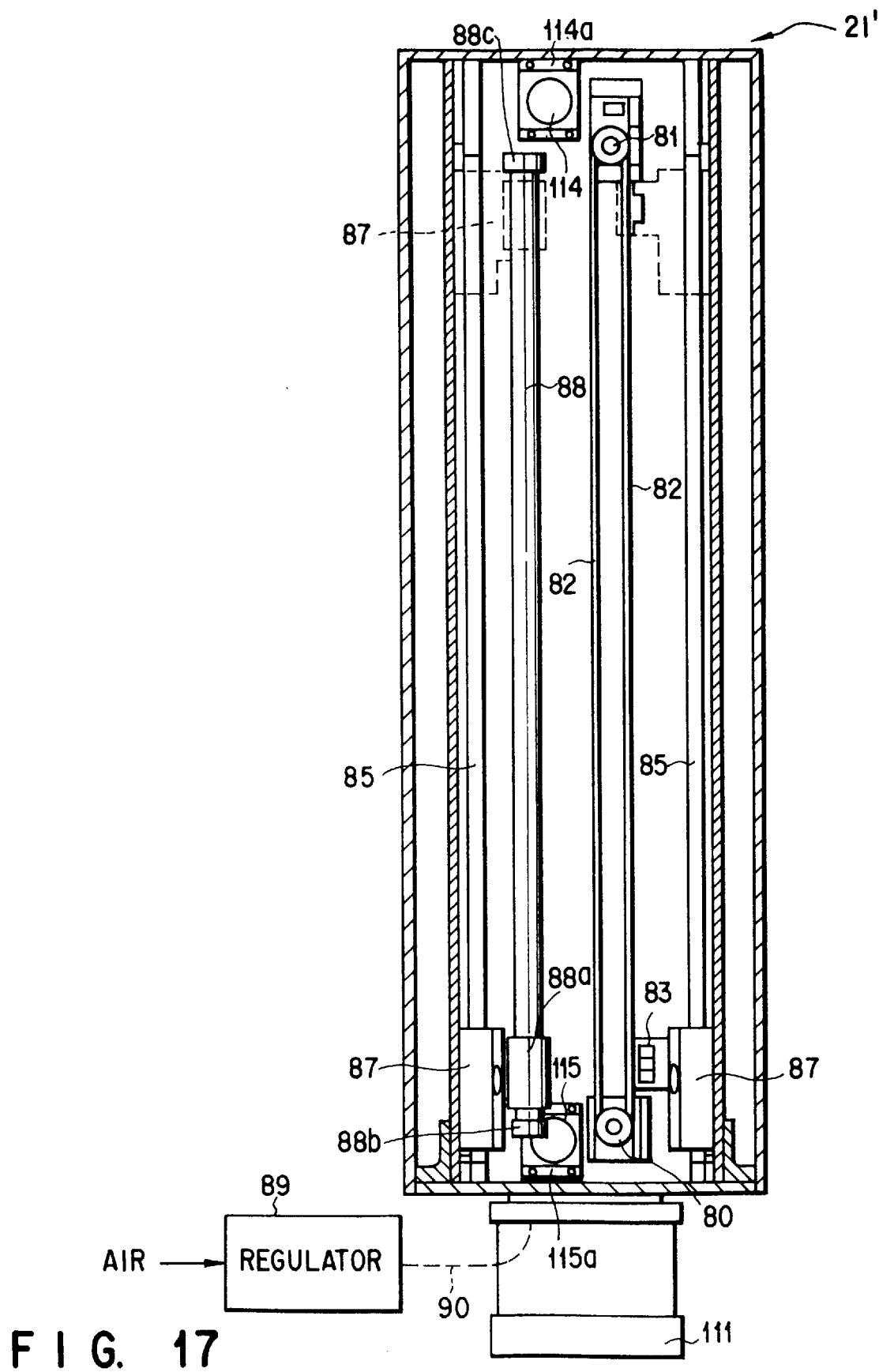
FIG. 17 is a side view showing the inside of the main wafer transfer mechanism, as viewed in the direction of arrow B in FIG. 15.

The structure and operation of the main wafer transfer mechanism 21' in the process station 20 will now be described with reference to FIGS. 14 to 18. FIG. 14 is a partially cut-out perspective view schematically showing a main part of the main wafer transfer mechanism 21', FIG. 15 is a vertical cross-sectional view showing the structure of the main part of the main wafer transfer mechanism 21', FIG. 16 is a cross-sectional plan view showing the main wafer transfer mechanism 21', as viewed in the direction of arrow A in FIG. 15, FIG. 17 is a side view showing the inside of the main wafer transfer mechanism 21', as viewed in the direction of arrow B in FIG. 15, and FIG. 18 is a side view showing the inside of the main wafer transfer mechanism 21', as viewed in the direction of arrow C in FIG. 15. In these figures, too, the structural parts common to those in the system of the preceding embodiment are denoted by like reference numerals.

As is shown in FIGS. 14 and 15, the main wafer transfer mechanism 21' has a cylindrical body 110 in which a wafer transfer member 73 serving as transfer means is supported so as to be movable in the vertical direction (direction Z). The cylindrical body 110 is supported on a rotary shaft of a drive motor 111. When the motor 111 is actuated, the cylindrical body 110 rotates on the rotary shaft along with the wafer transfer member 73. The motor 110 is fixed to a base plate 75 of the process system, and a flexible cable 76 for supplying power is wound around the motor 110. The cylindrical body 110 may be attached to another rotary shaft (not shown) rotated by the motor 110.

The cylindrical body 110 contains the wafer transfer member 73 so as to surround it. The cylindrical body 110 is provided with a plurality of openings 110a for transfer of wafers W among the process unit groups G1 to G5. The range of vertical movement of the wafer transfer body 73 is set such that wafers W can be transferred by the wafer transfer member 73 to all the process unit groups G1 to G5.

The wafer transfer member 73 has the same structure as that in the preceding embodiment. Three support forks 78a, 78b and 78c movable in the direction X (i.e. back-and-forth direction) are provided on a transfer base 77. Each support fork can pass through the openings 110a in the cylindrical body 110. As in the preceding embodiment, an X-directional drive unit includes a drive motor and a belt built in the transfer base 77.

The uppermost fork 78a of the three forks may be used exclusively for transferring cooled wafers W. In addition, heat-insulating plates may be provided among forks to prevent thermal interference.

As is shown in FIGS. 14 to 16, a pair of pulleys 80 and 81 are provided at an upper and a lower end region of a substantially central part of one inside region of the cylindrical body 110, as in the main wafer transfer mechanism 21 of the preceding embodiment. A vertical drive endless belt 82 is passed between the pulleys 80 and 81. The transfer base 77 of the wafer transfer member 73 is coupled to the vertical drive belt 82 by means of a belt clamp 83. The lower pulley 80, functioning as drive pulley, is coupled to a drive shaft 84a of drive motor 84 fixed on the bottom of cylindrical body 110.

As is shown in FIGS. 16 and 17, a pair of guide rails 85 are arranged in one inside region of the cylindrical body 110, as in the preceding embodiment. Sliders 87, which are provided at distal end portions of a pair of horizontal support rods 86 projected from the side faces of the transfer base 77, are slidably engaged with the guide rails 85, respectively. Thereby, the wafer transfer member 73 can be vertically moved, as in the preceding embodiment.

In addition, as shown in FIGS. 16 and 17, a rodless cylinder 88 is vertically provided between a central region of one inside region of the cylindrical body 110 and one of the guide rails 85, as in the preceding embodiment. A cylindrical movable member 88a is slidably provided on the rodless cylinder 88. These elements have the same structure as in the preceding embodiment. Since the movable member 88a is magnetically coupled to a piston in the cylinder 88, the wafer transfer member 73 and the piston can be simultaneously moved by means of the movable member 88a. Like the preceding embodiment, compressed air is supplied from a regulator 89 into the cylinder 88 via a lower-end port 88b. The pressure of the compressed air corresponds substantially to the weight of the wafer transfer member 73. An upper-end port 88c of the cylinder 88 is opened to the outside. In this embodiment, too, the wafer transfer member 73 can be vertically moved at high speed, without being influenced by the gravity of the wafer transfer member 73. Moreover, even if the drive belt 82 is cut, the wafer transfer member 73 is kept in its position by the lift acting in the cylinder 88 and is prevented from falling due to its weight. Therefore, there is no concern that the wafer transfer member 73 or cylindrical body 110 is broken.

As is shown in FIGS. 14, 16 and 18, four sleeves 92, in which flexible cables 91 for supplying power and control signals to the wafer transfer member 73 are vertically extended, are provided in a central region and both side regions of the other inside part of the cylindrical body 110, as in the preceding embodiment. A slider 94 projecting from the side face of the transfer base 77 is guided along a guide 93 defined by the central two sleeves 92.

As is shown in FIG. 14, a pair of inlets 110c for introducing cleaning air into the cylindrical body 110 are formed in an upper surface of the cylindrical body 110 on both sides of a rotational shaft 110b. The above-mentioned cleaning air flows from the ceiling side into the main wafer transfer mechanism 21' via the inlets 110c. The space for vertical movement of the wafer transfer member 73 is kept clean at all times by the downward cleaning air.

Figure 19:
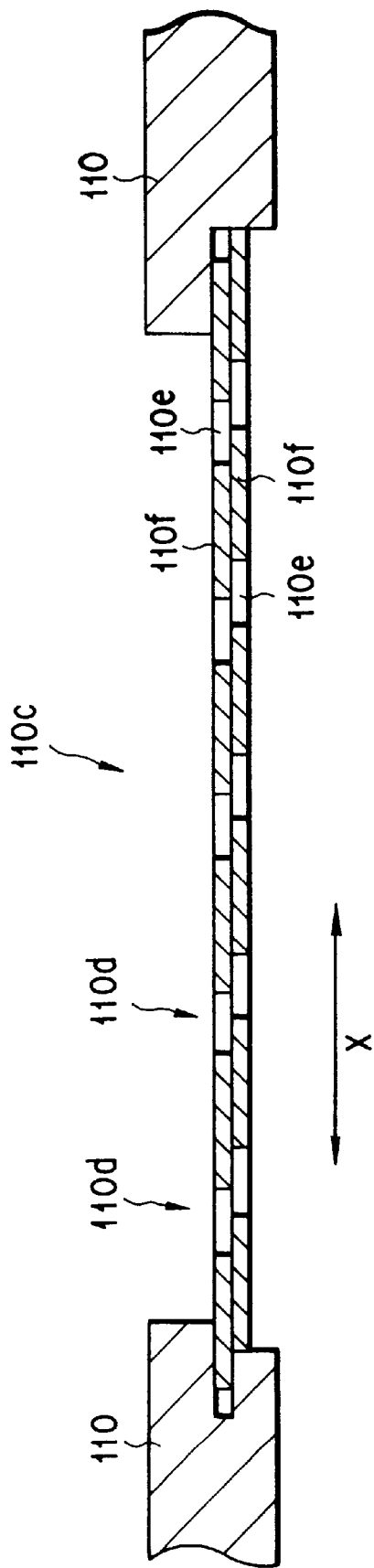
FIG. 19 is a cross-sectional view showing the structure of a clean air inlet of the main wafer transfer mechanism.

Each of the inlets 110c is provided with a plurality of movable slit windows 110d serving as means for controlling the quantity of air to be introduced. The movable slit windows 110d can be opened such that, for example, an upper one of two plate members 110f each having slits 110e is displaced in the direction X, as illustrated in FIG. 19.

Accordingly, the quantity of air to be introduced into the main wafer transfer mechanism 21' can be controlled by opening the slit windows 110d by a predetermined amount in accordance with the external/internal environment of the main wafer transfer mechanism 21'. Thus, the cleaning operation can be optimally performed in the main wafer transfer mechanism 21'.

As is shown in FIGS. 15 and 16, vertical partition plates 112a and 113a are provided on both inside regions within the cylindrical body 110, as in the preceding embodiment. Ducts 112b and 113b are defined by the rear surfaces of the partition plates 112a and 113a and the walls of the cylindrical body 110. Air exhaust ports 112a and 113a serving as exhaust means are provided near upper and lower end portions of the partition plates 112a and 113a. Exhaust fans 114a and 115a are disposed at the exhaust ports 114 and 115. Air exhausted by the exhaust fans 114a and 115a is exhausted to the outside from the lower part of the main wafer transfer mechanism 21' via the ducts 112b and 113b.

The outputs of the exhaust fans 114a and 115a are controlled in accordance with the driving of the motor 84. Specifically, when the wafer transfer member 73 is raised by the drive motor 84, the outputs of the exhaust fans 114a of air exhaust ports 114 provided near the upper ends are increased. When the wafer transfer member 73 is lowered by the drive motor 84, the outputs of the exhaust fans 115a of air exhaust ports 115 provided near the lower ends are increased.

Accordingly, the air to be compressed at the upper or lower end regions of the cylindrical body 110 while the wafer transfer member 73 is raised or lowered within the cylindrical body 110 is exhausted to the outside of the main wafer transfer mechanism 21' via the air exhaust ports 114 or 115. As a result, the variation in pressure within the cylindrical body 110 is decreased, and particles are prevented from flowing out of the cylindrical body 110 due to leak of pressurized air near the upper and lower end regions. In particular, the variation in pressure within the cylindrical body 110 is further decreased by setting the quantity of air to be exhausted by the fans provided at the lower end region at a maximum value.

As stated above, the flow-out of particles due to leak of pressurized air can be prevented more effectively by providing the exhaust fans 114a and 115a at air exhaust ports 114 and 115 and by controlling the outputs of exhaust fans 114a and 115a. However, the flow-out of particles can be prevented only by providing the air exhaust ports 114 and 115, without providing the exhaust fans 114a and 115a.

The exhaust fans 114a and 115a may be located not only near the air exhaust ports 114 and 115 (i.e. inlets of ducts 112b and 113b), but also midway along the ducts 112b and 113b or at the outlets of the ducts 112b and 113b.

Figure 20:
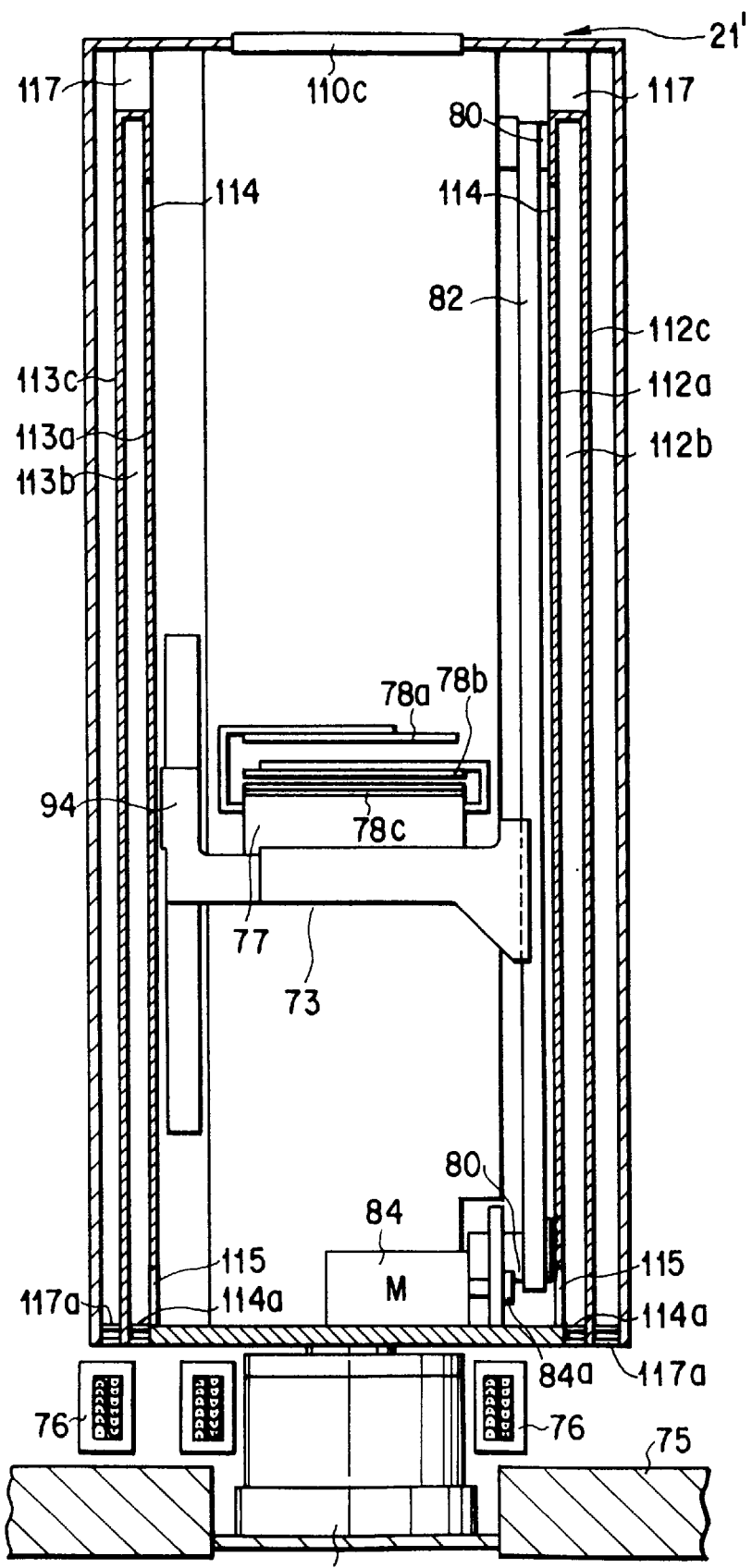
FIG. 20 is a vertical cross-sectional view showing the structure of a main part of another example of the main wafer transfer mechanism according to the present invention.

As is shown in FIG. 20, other ducts 112c and 113c may be provided outside the ducts 112b and 113b, and additional air exhaust ports 117 communicating with the ducts 112c and 113c may be provided near the upper end of the cylindrical body 110. In this embodiment, exhaust fans 114a and 117a are provided at the outlets of the ducts 112b, 113b, 112c and 113c. Since the downward flow of cleaning air is formed within the entire system, air tends to be more compressed when the wafer transfer member 73 is raised, i.e. in the region near the upper end of the cylindrical body 110. Thus, the flow-out of particles due to leak of pressurized air can be prevented more effectively by constructing the air exhaust ports near the upper end of cylindrical body 110 in two stages, as mentioned above.

The inside of the cylindrical body 110 can be set at a negative pressure level by providing the exhaust fans 114a and 115a. However, the inside of the cylindrical body 110 can also be set at a negative pressure level by providing, e.g. an exclusive-use exhaust fan at the lower part of the cylindrical body 110, in place of the exhaust fans 114a and 115a. As has been described above, by setting the inside of the cylindrical body 110 at a negative pressure level, the flow-out of particles to each unit from the cylindrical body 110 can be prevented.

Furthermore, in this embodiment, the cylindrical body 110 is provided so as to surround the wafer transfer member 73, thereby preventing disturbance of air flow due to θ-directional rotation of the main wafer transfer mechanism 21'. Accordingly, the flow-out of particles from the main wafer transfer mechanism 21' to each unit can be effectively prevented in combination with the structure as described with reference to FIG. 12, wherein the cleaning air is let to flow from the rear side of each unit to the main wafer transfer mechanism 21' via the opening 33c in each unit.

In each of the above-describe embodiments, the arrangement and structure of the parts of the process system are only exemplified, and various modifications can be made. For example, in the above embodiments, each of the process unit groups G1 and G2 in the process station 20 comprises spinner-type process units in two stages and each of the process unit groups G3 and G4 comprises open-type process units and wafer transfer units in eight stages. However, the number of stages is not limited. It is possible to combine a spinner-type process unit with an open-type process unit or a wafer transfer unit in one group. Furthermore, another type of process unit, such as scrubber unit, may be added.

The positional relationship between the cassette station 10 and interface section 30, disposed on both sides of the process station 20, as shown in FIGS. 1 and 2, may be reversed. In this case, the cassette station 10 and interface section 30 may be detachably attached to the process station 20 by means of proper coupling members 97 (e.g. bolts). The control panel 100 may be detachably attached to the front of the cassette station 10. Thereby, the layout of the system may be easily changed, and no parts may be newly designed or manufactured, resulting in a decrease in cost.

In the above embodiments, the transfer mechanism has the transfer member with three forks. The number of forks, however, is not limited.

In the above embodiments, the processing apparatus according to the present invention is applied to the coating/developing process system for semiconductor wafers. The processing apparatus according to the present invention, however, is also applicable to other process systems. The objects to be processed are not limited to semiconductor wafers. The processing apparatus of this invention is applicable to, for example, LCD substrates, glass substrates, CD substrates, photomasks, printed boards, ceramic substrates, etc.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

We claim:

1. A processing apparatus comprising:
    a plurality of process unit groups each including a plurality of process units for subjecting an object to a series of processes, said process units being arranged vertically in multiple stages, an object transfer space being defined among the process unit groups;

transfer means for transferring the object, said transfer means having a transfer member vertically movable in the object transfer space, said transfer member being capable of transferring the object to each of said process units; and means for reducing a variation in condition of the object transfer space.

2. The processing apparatus according to claim 1, wherein said means for reducing a variation in condition of the object transfer space comprises means for forming a downward air flow in the object transfer space, means for controlling the quantity of the downward air flow, and means for controlling the pressure in the object transfer space.

3. The processing apparatus according to claim 2, wherein said means for reducing a variation in condition of the object transfer space further comprises temperature control means for controlling the temperature of the object transfer space.

4. The processing apparatus according to claim 1, wherein said means for reducing a variation in condition of the object transfer space comprises exhaust means for exhausting air compressed by vertical movement of the transfer means.

5. The processing apparatus according to claim 4, wherein said exhaust means includes an exhaust port and an exhaust fan.

6. The processing apparatus according to claim 4, wherein said exhaust means includes exhaust ports provided at upper and lower end portions of the transfer means, exhaust fans associated with said exhaust ports, and means for increasing the output of the exhaust fans associated with the upper end portion of the transfer means when the transfer member is raised and for increasing the output of the exhaust fans associated with the lower end portion of the transfer means when the transfer member is lowered.

7. The processing apparatus according to claim 4, wherein said exhaust means includes a plurality of exhaust ports arranged vertically, and exhaust fans associated with said exhaust ports, the quantity of exhaust air of the exhaust fan associated with the lowermost exhaust port being greatest.

8. The processing apparatus according to claim 1, wherein said transfer means includes a plurality of transfer members.

9. The processing apparatus according to claim 1, wherein the pressure in the object transfer space is set to be higher than the outside pressure of the apparatus.

10. A processing apparatus comprising:

a plurality of process unit groups each including a plurality of process units for subjecting an object to a series of processes, said process units being arranged vertically in multiple stages, an object transfer space being defined among the process unit groups;

transfer means for transferring the object, said transfer means having a transfer member vertically movable in the object transfer space, said transfer member being capable of transferring the object to each of said process units;

means for forming a downward cleaning air flow in the object transfer space; and means for preventing air from coming into each of said process units from said object transfer space.

11. The processing apparatus according to claim 10, wherein said means for preventing air from incoming comprises a duct provided vertically in the object transfer space, and exhaust means for exhausting air from the object transfer space to the duct.

12. The processing apparatus according to claim 10, wherein said means for preventing air from incoming comprises means for forming a flow of cleaning air flowing from each of said process units to the object transfer space.

13. The processing apparatus according to claim 10, wherein said transfer means comprises a plurality of transfer members.

14. The processing apparatus according to claim 10, wherein the pressure in the object transfer space is set to be higher than the outside pressure of the apparatus.

15. A processing apparatus comprising:

a plurality of process unit groups each including a plurality of process units for subjecting an object to a series of processes, said process units being arranged vertically in multiple stages, an object transfer space being defined among the process unit groups;

transfer means for transferring the object, said transfer means having a transfer member vertically movable in the object transfer space, said transfer member being capable of transferring the object to each of said process units;

an air inlet provided in an upper region of the object transfer space;

an exhaust port provided in a lower region in the object transfer space;

a pipe for connecting said air inlet and the exhaust port, thereby forming a circulation passage; and air feed means for circulating cleaning air from the air inlet to the exhaust port so that a downward air flow may be formed in the object transfer space.

16. The processing apparatus according to claim 15, further comprising air quantity control means for controlling the air quantity of the circulating cleaning air.

17. The processing apparatus according to claim 16, wherein said air quantity control means includes an outside air introducing section for introducing outside air and a damper provided in the outside air introducing section.

18. The processing apparatus according to claim 16, further comprising pressure control means for controlling pressure in the object transfer space.

19. The processing apparatus according to claim 16, further comprising temperature control means for controlling the temperature of the object transfer space.

20. The processing apparatus according to claim 16, wherein said transfer means includes a support member for supporting the transfer member, said support member extending vertically in the object transfer space, and said support member includes a duct provided vertically in the support member and exhaust means for exhausting air from the object transfer space to the duct.

21. The processing apparatus according to claim 20, wherein said exhaust means includes an exhaust port and an exhaust duct.

22. The processing apparatus according to claim 20, wherein said exhaust means includes a plurality of exhaust ports arranged vertically, and exhaust fans associated with said exhaust ports, the quantity of exhaust air of the exhaust fan associated with the lowermost exhaust port being greatest.

23. The processing apparatus according to claim 15, wherein said transfer means includes a plurality of transfer members.

24. The processing apparatus according to claim 15, wherein the pressure in the object transfer space is set to be higher than the outside pressure of the apparatus.

25. A processing apparatus comprising:
- a plurality of process unit groups each including a plurality of process units for subjecting an object to a series of processes, said process units being arranged vertically in multiple stages, an object transfer space being defined among the process unit groups;
- transfer means for transferring the object, said transfer means having a transfer member vertically movable in the object transfer space, said transfer member being capable of transferring the object to each of said process units;
- a duct provided vertically in said object transfer space; and
- exhaust means for exhausting air compressed due to vertical movement of the transfer member to the duct.

26. The processing apparatus according to claim 25, wherein said exhaust means includes an exhaust port and an exhaust fan.

27. The processing apparatus according to claim 26, wherein said exhaust means includes exhaust ports provided at upper and lower end portions of the duct, exhaust fans associated with said exhaust ports, and means for increasing the output of the exhaust fans associated with the upper end portion of the transfer means when the transfer member is raised and for increasing the output of the exhaust fans associated with the lower end portion of the transfer means when the transfer member is lowered.

28. The processing apparatus according to claim 25, wherein said exhaust means includes a plurality of exhaust ports arranged vertically, and exhaust fans associated with said exhaust ports, the quantity of exhaust air of the exhaust fan associated with the lowermost exhaust port being greatest.

29. The processing apparatus according to claim 27, wherein said exhaust means has another exhaust port at an upper end portion of the duct.

30. The processing apparatus according to claim 25, wherein said transfer means includes a plurality of transfer members.

31. The processing apparatus according to claim 25, wherein said transfer means has a frame body surrounding the region of movement of the transfer member.

32. The processing apparatus according to claim 25, wherein the pressure in the object transfer space is set to be higher than the outside pressure of the apparatus.

33. A processing apparatus comprising:
- a plurality of process unit groups each including a plurality of process units for subjecting an object to a series of processes, said process units being arranged vertically in multiple stages, an object transfer space being defined among the process unit groups;
- transfer means for transferring the object, said transfer means having a transfer member vertically movable in the object transfer space, said transfer member being capable of transferring the object to each of said process units, and a frame body surrounding the region for movement of the transfer member;
- means for forming a downward cleaning air flow in the object transfer space; and
- means for forming a flow of cleaning air flowing from each of said process units to the object transfer space, wherein the cleaning air flowing out of each of said process units to the object transfer space flows downward along the outside of the frame body by virtue of said downward cleaning air flow.

34. The processing apparatus according to claim 33, wherein said frame body has a cylindrical shape.

35. The processing apparatus according to claim 33, wherein the pressure in the frame body is lower than the pressure in other region of the object transfer space.

36. The processing apparatus according to claim 33, wherein an upper part of the frame body is provided with an introducing port for introducing cleaning air.

37. The processing apparatus according to claim 36, wherein said introducing port is provided with control means for controlling the quantity of air to be introduced.

38. The processing apparatus according to claim 33, wherein said transfer means has a plurality of transfer members.

39. A coating/developing processing apparatus comprising:
- at least one first process unit group in which process units including a resist coating unit for coating a resist and a developing unit for developing a pattern of the resist are vertically stacked; and
- at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked,
  - wherein said first process unit group has such an arrangement that the coating unit is placed below the developing unit.

40. The processing apparatus according to claim 39, further comprising means for reducing a variation in condition of the object transfer space.

41. The processing apparatus according to claim 39, further comprising means for forming a downward cleaning air flow in the object transfer space, and means for preventing air from entering each of the process units.

42. A coating/developing processing apparatus comprising:
- at least one first process unit group in which process units including a resist coating unit for coating a resist and a developing unit for developing a pattern of the resist are vertically stacked; and
- at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked,
  - wherein said second process unit group has such an arrangement that the cooling unit is placed below the baking unit.

43. The processing apparatus according to claim 42, wherein said second process unit has such an arrangement that the extension unit is situated between the cooling unit and the baking unit.

44. The processing apparatus according to claim 42, further comprising means for reducing a variation in condition of the object transfer space.

45. The processing apparatus according to claim 42, further comprising means for forming a downward cleaning air flow in the object transfer space, and means for preventing air from entering each of the process units.

46. A coating/developing process system for subjecting an object to a resist coating process and a developing process, said system comprising:
- a process section for subjecting the object to a series of processes including the resist coating process and the developing process;

a transfer section for performing transfer of the object with another system and with said process section; and an interface section for performing transfer of the object with the process section and with an exposure device, wherein said process section comprises:

at least one first process unit group in which process units including a resist coating unit for coating a resist and a developing unit for developing a pattern of the resist are vertically stacked; and at least one second process unit group in which at least one or all of an alignment unit for aligning an object to be processed, a baking unit for baking the object, a cooling unit for cooling the object, an adhesion unit for subjecting the object to an adhesion process, and an extension unit are vertically stacked, wherein said second process unit group has such an arrangement that the cooling unit is placed below the baking unit.

47. The processing apparatus according to claim 46, wherein said second process unit has such an arrangement that the extension unit is situated between the cooling unit and the baking unit.

48. The processing apparatus according to claim 46, further comprising means for reducing a variation in condition of the object transfer space.

49. The processing apparatus according to claim 46, further comprising means for forming a downward cleaning air flow in the object transfer space, and means for preventing air from entering each of the process units.

* * * * *